US008344440B2

(12) United States Patent
Pikhay et al.

(10) Patent No.: US 8,344,440 B2
(45) Date of Patent: Jan. 1, 2013

(54) THREE-TERMINAL SINGLE POLY NMOS NON-VOLATILE MEMORY CELL WITH SHORTER PROGRAM/ERASE TIMES

(75) Inventors: Evgeny Pikhay, Haifa (IL); Micha Gutman, Haifa (IL); Yakov Roizin, Afula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 169 days.

(21) Appl. No.: 13/011,774

(22) Filed: Jan. 21, 2011

(65) Prior Publication Data
US 2011/0121379 A1 May 26, 2011

Related U.S. Application Data

(63) Continuation-in-part of application No. 12/730,186, filed on Mar. 23, 2010, now abandoned, and a continuation of application No. 12/398,912, filed on Mar. 5, 2009, now Pat. No. 7,859,043, and a continuation-in-part of application No. 12/037,051, filed on Feb. 25, 2008, now Pat. No. 7,800,156.

(60) Provisional application No. 61/115,773, filed on Nov. 18, 2008.

(51) Int. Cl.
*H01L 29/788* (2006.01)
(52) U.S. Cl. ............... 257/315; 257/314; 257/E29.305; 257/E29.306
(58) Field of Classification Search .................. 257/314, 257/315, E21.422, E29.305, E29.306
See application file for complete search history.

(56) References Cited

U.S. PATENT DOCUMENTS

| | | | |
|---|---|---|---|
| 4,794,562 | A | 12/1988 | Kato et al. |
| 5,051,951 | A | 9/1991 | Maly et al. |

(Continued)

FOREIGN PATENT DOCUMENTS
EP 0271932 6/1988

OTHER PUBLICATIONS

Miyamoto et al. "An Experimental 5-V-Only 256-kbit CMOS EEPROM With a High-Performance Single-Polysilicon Cell", IEEE Journal of Solid State Circuits, vol. sc-21, No. 5, Oct. 1986, pp. 852-860.

(Continued)

*Primary Examiner* — Jerome Jackson, Jr.
*Assistant Examiner* — Paul Budd
(74) *Attorney, Agent, or Firm* — Bever, Hoffman & Harms, LLP; Patrick T. Bever

(57) ABSTRACT

A three terminal non-volatile memory (NVM) cell for a CMOS IC is formed by either a standard CMOS process flow or a slightly modified CMOS process flow. The NVM cell includes read and injection transistors that share a common floating gate. The floating gate includes a portion disposed over the channel region of the read transistor, a portion disposed over the channel region of the injection transistor, and a portion extending into an enlarged drain diffusion area away from the channel regions, whereby the gate-to-drain capacitance is higher than the gate-to-source capacitances. The source/drain of the injection transistor are formed using different LDD implants to achieve faster program/erase. Alternatively, an optional CHE enhancing implant is added to the source/drain of the injection transistor to enhance CHE programming. Both HV LDD and LV LDD implants are introduced together enabling LDD implant merging under the floating gate extension.

24 Claims, 21 Drawing Sheets

U.S. PATENT DOCUMENTS

| | | |
|---|---|---|
| 5,188,976 A | 2/1993 | Kume et al. |
| 5,354,703 A | 10/1994 | Gill |
| 5,455,789 A | 10/1995 | Nakamura et al. |
| 5,646,430 A | 7/1997 | Kaya et al. |
| 5,687,115 A | 11/1997 | Wong et al. |
| 5,777,361 A | 7/1998 | Parris et al. |
| 5,844,268 A | 12/1998 | Noda et al. |
| 5,962,889 A | 10/1999 | Yamauchi et al. |
| 6,238,979 B1 | 5/2001 | Bergemont |
| 6,266,269 B1 | 7/2001 | Karp et al. |
| 6,645,814 B1 | 11/2003 | Lindsay et al. |
| 6,660,603 B2 | 12/2003 | Mitros |
| 6,678,190 B2 | 1/2004 | Yang et al. |
| 6,905,929 B1 | 6/2005 | Merrill et al. |
| 7,033,891 B2 | 4/2006 | Wilson et al. |
| 7,078,761 B2 | 7/2006 | Wang et al. |
| 7,177,185 B2 | 2/2007 | Jung |
| 7,209,392 B2 | 4/2007 | Chen et al. |
| 7,227,234 B2 | 6/2007 | Roizin et al. |
| 7,312,499 B2 | 12/2007 | Iwata et al. |
| 7,372,097 B2 | 5/2008 | Forbes et al. |
| 7,388,783 B2 | 6/2008 | Sakui |
| 7,427,791 B2 | 9/2008 | Matsuzaki et al. |
| 7,544,557 B2 | 6/2009 | Levin et al. |
| 7,567,457 B2 | 7/2009 | Nazarian et al. |
| 2002/0005543 A1 * | 1/2002 | Di Pede et al. ............... 257/314 |
| 2002/0190310 A1 | 12/2002 | Boivin |
| 2003/0198087 A1 | 10/2003 | Kinsey et al. |
| 2005/0104118 A1 | 5/2005 | Diorio et al. |
| 2007/0195607 A1 | 8/2007 | Eitan et al. |
| 2008/0137408 A1 | 6/2008 | Roizin et al. |
| 2008/0160689 A1 | 7/2008 | Fenigstein et al. |
| 2008/0186772 A1 | 8/2008 | Horch |
| 2008/0225593 A1 | 9/2008 | Mitros et al. |
| 2008/0273392 A1 | 11/2008 | Ratnakumar et al. |
| 2008/0290395 A1 | 11/2008 | Jeong |
| 2009/0114972 A1 | 5/2009 | Liu |
| 2009/0122603 A1 | 5/2009 | Liu et al. |
| 2009/0159967 A1 | 6/2009 | Edwards et al. |

OTHER PUBLICATIONS

Choi et al. "High Speed Flash Memory and 1T-DRAM on Dopant Segregated Schottky Barrier (DSSB) FinFET SONOS Device for Multi-Functional SoC Applications", IEEE International 2008, Dec. 15-17, 2008, pp. 223-226.

O'Shea et al. "Compact Model Development for a New Non-Volatile Memory Cell Architecture", Proc. IEEE 2002 Int. Conference on Microelectronic Test Structures, vol. 15, Apr. 2002, pp. 151-156.

Roizin et al. "Low-Cost Embedded NVM for Power Management Designs", Tower Semiconductor, Ecnmag.com, Oct. 1, 2008, 3 pages.

Mori et al. "Thickness Scaling Limitation Factors of ONO Interpoly Dielectric for Nonvolatile Memory Devices", IEEE Transactions on Electron Devices, vol. 43, No. 1, Jan. 1996, pp. 47-53.

* cited by examiner

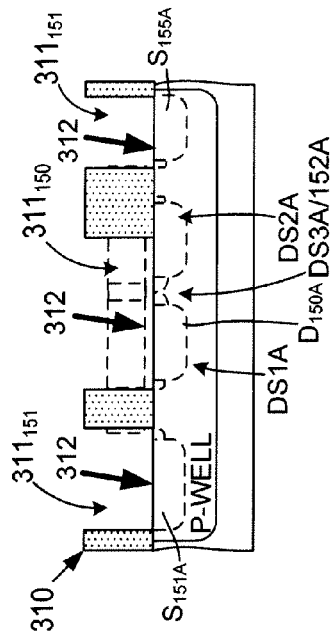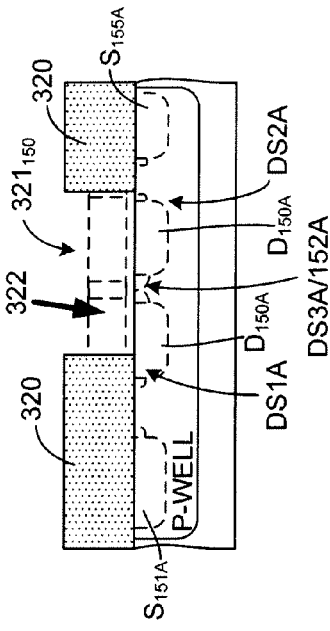
FIG. 7(A)　　　FIG. 7(B)
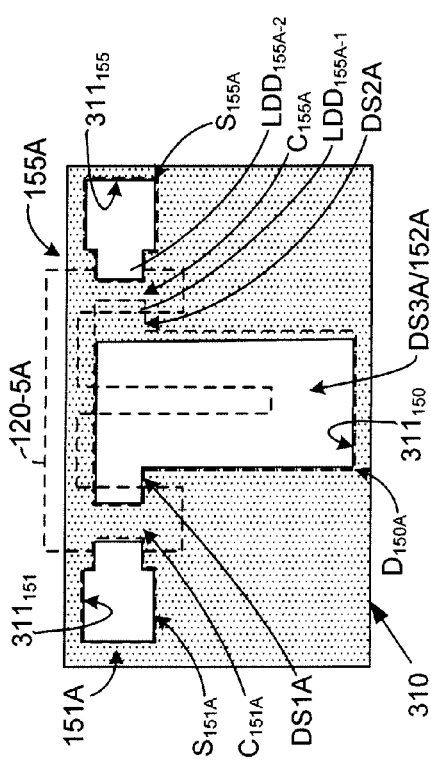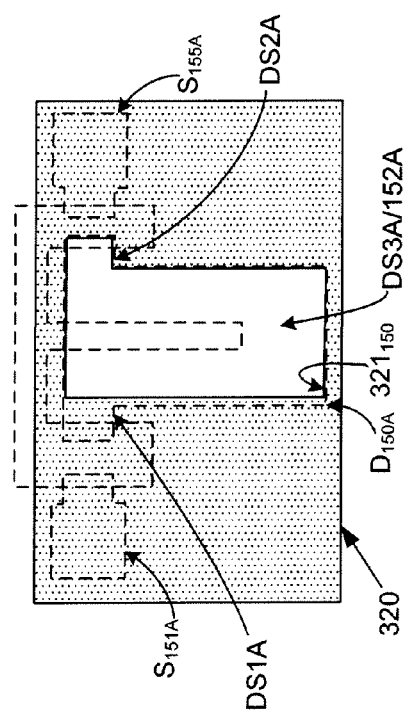
FIG. 6(A)　　　FIG. 6(B)

FIH. 19

THREE-TERMINAL SINGLE POLY NMOS NON-VOLATILE MEMORY CELL WITH SHORTER PROGRAM/ERASE TIMES

RELATED APPLICATIONS

This application is a continuation in part of U.S. patent application for "Three-Terminal Single Poly NMOS Non-Volatile Memory Cell", U.S. application Ser. No. 12/730,186, filed Mar. 23, 2010, which is a continuation of U.S. patent application for "Three-Terminal Single Poly NMOS Non-Volatile Memory Cell", U.S. application Ser. No. 12/398,912, filed Mar. 5, 2009 which is a continuation in part of U.S. patent application for "Asymmetric Single Poly NMOS Non-Volatile Memory Cell", U.S. application Ser. No. 12/037,051, filed Feb. 25, 2008. This application also claims priority of U.S. Provisional patent application for "Three Terminal NVM Cell And Memory Array", U.S. App. Ser. No. 61/115,773, filed Nov. 18, 2008.

FIELD OF THE INVENTION

The present invention relates to non-volatile memory (NVM) cells. More specifically, the present invention relates to NVM cell arrays that are "embedded" in (i.e., integrally formed with) complementary metal-oxide-semiconductor (CMOS) integrated circuits (ICs), and to methods for fabricating the NVM cells in an inexpensive manner using standard CMOS process flows.

BACKGROUND OF THE INVENTION

"CMOS" refers to both a particular style of digital circuitry design, and the family of processes used to implement that circuitry on IC "chips" or "die". CMOS logic uses a combination of p-type and n-type metal-oxide-semiconductor field-effect transistors (MOSFETs) to implement logic gates and other circuits found in computers, telecommunication equipment, and signal processing equipment. Typical commercial CMOS ICs include millions (or hundreds of millions) of n-type and p-type MOSFETs.

Most CMOS IC manufacturers (aka, "fabs") generate standardized process "flows" for generating CMOS ICs on monocrystalline silicon wafers. Each CMOS process flow includes a series of processing steps (e.g., material deposition, photolithographic exposure, and etching) that are required to produce a desired CMOS IC product. Standard CMOS process flows are typically developed to produce "normal" CMOS IC devices (i.e., CMOS IC devices that comprise mainly volatile n-type and p-type MOSFETS) using a minimum number of processing steps in order to minimize overall production costs. Significant effort is typically expended by each manufacturer to make their standard CMOS process flow as time and cost efficient as possible. Once a standard CMOS flow is optimized, it can typically be used to make a large number of CMOS IC designs merely by providing a different set of photolithography masks for each IC design, and then repeating the standard CMOS process flow using the selected set of photolithography masks.

Although most standard CMOS process flows facilitate the inclusion of non-MOSFET circuit components into the CMOS IC products, a problem arises when a circuit design requires a circuit component that cannot be produced by the standard CMOS process flow. In this case, particularly when several additional steps are required to produce a particular nonstandard circuit component, where each step requires a corresponding additional mask and associated, the CMOS process flow must be significantly modified at great expense to include the additional steps in order to produce the needed circuit component. It is therefore desirable to develop methods for producing the non-standard circuit component using the steps of the existing CMOS process flow, or using only a small number of additional process steps that can be included in the standard CMOS process flow with minimal effect on the standard CMOS circuit elements.

Non-volatile memory (NVM) or "floating gate" cells represent one type of non-standard circuit component that is often needed in large scale CMOS ICs. In contrast to volatile (aka primary storage) memory built of typical n-type and p-type MOSFETs which require continuous power to retain stored information, NVM cells are able to retain a stored state even when power to an IC is turned off, thereby allowing the IC to "remember" important operating conditions and information upon restart. Several types of NVM cells have been developed that can be produced with minimal changes to a standard CMOS process flow. One NVM cell that has a small floating gate capacitively coupled to the drain area is disclosed in U.S. Pat. No. 6,678,190. This NVM cell is a programmable read only memory comprising two serially connected P-type metal-oxide semiconductor (MOS) transistors, wherein the floating gate coupling to the source and drain is symmetric, and wherein a control gate is omitted because a special gate bias is not necessary in the programming mode. A problem with the PMOS NVM cells of U.S. Pat. No. 6,678,190 is that only a small portion of Vd is transferred to the floating gate, so that a subsequent erase operation is practically impossible, thus limiting the application of corresponding cells to OTP (one-time program) memories only.

What is needed is an NVM cell that is small to medium in size, exhibits high endurance (allows multiple cycling, i.e., program/erase operations), and can be produced using either a standard single-poly CMOS process flow (i.e., a CMOS process flow including only a single polysilicon layer), or a slightly modified single-poly CMOS process flow that adds only one or two additional masks to a standard CMOS process flow.

SUMMARY OF THE INVENTION

The present invention is directed to medium-sized, three-terminal (two-channel) NVM (logic) cells that exhibit high endurance and are produced using either a standard single-poly CMOS process flow (i.e., a CMOS process flow that does not require the use of masks other than those used to produce standard CMOS components), or using a slightly modified standard single-poly CMOS process flow that utilizes only one or two additional masks and processes that are consistent with the standard CMOS process flow (i.e., that have no effect on the standard CMOS circuit components). Each NVM cell includes two NMOS transistors—a read transistor and an injection (program/erase) transistor that share a common drain region and a common floating gate. In the three-terminal embodiments, the read transistor and injection transistor have respective (first and second) source regions disposed adjacent to the shared drain region, and the floating gate has a first portion disposed over a first channel region located between the first source region and the drain region, a second portion disposed over a second channel region located between the second source region and the drain region, and a third (extension) portion that overlaps (i.e., extends "over") the shared drain (diffusion) region at a location away from the first and second channel regions, and is coupled to the drain region such that the gate-to-drain capacitance between the floating gate and the drain region is substantially higher than the gate-to-source capacitances between the floating gate and either of the first and second source regions.

According to the present invention, various techniques are utilized to modify the injection transistor of the two-channel NVM cell to facilitate shorter program times, shorter erase times, or both shorter program and erase times. In a first specific embodiment, the source and drain regions of the injection transistor) are fabricated using different low-voltage (LV) and high voltage (HV) lightly doped drain (LDD) implants (e.g., the drain region is formed using an HV-LDD implant and the source region is formed using an LV-LDD implant). This technique provides short erase times, but increases the amount of time needed to program the NVM cells (i.e., in comparison to cells in which both the injection source and drain are formed using LV-LDD implants). Alternatively, the opposite LDD implant pattern (e.g., the source region is formed using an HV-LDD implant and the drain region is formed using an LV-LDD implant) is used to provide shorter program times and longer erase times. In other specific embodiments, at least one extra mask is used to provide a channel-hot-electron (CHE) enhancing implant (e.g., boron-difluoride ($BF_2$)) in the drain and source regions of the injection transistor. In one specific embodiment the source and drain regions of the injection transistor are fabricated using the standard CMOS process flow, and then the CHE enhancing implant is formed simultaneously in both the source and drain regions using an additional mask (i.e., such that both a first diffusion region extending from said drain region into the second channel region and a second diffusion region extending from said second source region into the second channel region include a sum of the second doping concentration and the CHE enhancing implant). In another specific embodiment the source and drain regions of the injection transistor are entirely fabricated using one or more additional masks to diffuse both an LDD implant and the CHE enhancing implant into the source and drain regions of the injection transistor (i.e., such that the first diffusion region extending from said drain region into the second channel region and the second diffusion region extending from said second source region into the second channel region include a sum of the third doping concentration and the implant, where the third doping concentration is modified from the first doping concentration and the second doping concentration to further enhance CHE programming and/or BBT erasing operations).

The modified injection transistors formed in accordance with the various methods mentioned above facilitate desirable channel hot electron (CHE) or secondary channel hot electron (CHISEL) programming of the two-channel NVM cells of the present invention. In the first case this is achieved by applying a positive programming voltage to the drain region and coupling the injection transistor's (second) source region to ground (while the source of reading transistor is floating), whereby the drain voltage is transferred to the floating gate as a result of the high capacitive coupling, and CHE injection from the drain region into the floating gate is induced in the region of the injection transistor. In the second embodiment (CHISEL), the programming process is enhanced by applying a negative bias to the transistor bulk. For this purpose, the whole device is placed in an isolated P-well, or positive voltage is applied to the source of the injection transistor with the bulk connected to ground while source to drain voltage difference is kept constant. Erasing the floating gate involves floating the drain diffusion and the source of the read transistor and applying the positive voltage to the injection (second) source region, thereby causing Band-to-Band Tunneling (BBT) generation of holes and their injection into the floating gate. Tests performed on two-channel NVM cells produced in accordance with the present invention exhibit superior performance (suppressed read disturb) than comparable one-channel (two-terminal) NVM cells. During cell read-out operations a read voltage lower than the required programming voltage, e.g., 1.5-2V, is applied to the shared drain region, the injection (second) source region is disconnected (floating), and the read (first) source region is coupled directly to ground, and the cell drain-source current is compared with the reference current to test whether the cell is programmed or erased. Because the read transistor omits the source/drain enhancements utilized in the injection transistor, CHE are not expressed in the read transistor during the read operation, thus read-disturb effects in the memory device are strongly suppressed. Therefore, three-terminal NVM cells produced in accordance with the present invention are ideal for incorporating into low cost CMOS integrated circuits (ICs) that require high endurance, high density (i.e., several kbits to 1Mbit) NVM cells.

According to one embodiment of the invention, a CMOS IC includes both high voltage (HV) MOSFETs and low voltage (LV) MOSFETs and at least one three-terminal NVM cell formed on a substrate using one of the methods described above. The HV MOSFET and the LV MOSFET are fabricated using processing steps that are optimized for producing these different devices. For example, HV MOSFETs are produced using lower density LDD (HV-LDD) implants, thicker gate oxides (HV-OX) and wider polysilicon gate lines compared with LV devices. HV transistors are optimized for the higher (e.g., 5V or 3.3V) applied voltages. In contrast, LV MOSFETs are produced using higher density LDD (LV-LDD) implants, thinner gate oxides (LV-OX) and narrower polysilicon gate lines that are optimized for the lower (e.g., 1.8V) applied voltages expected on LV MOSFETs during operation. The various process steps used to fabricate HV and LV MOSFETs are included in standard CMOS process flows. In accordance with an embodiment of the invention, these various HV and LV process steps are utilized to entirely fabricate the three-terminal NVM cells by using the LV gate design rules (LV DR) to define the width of the extension portion of the floating gate, and utilizing one or more of the LDD implants (e.g., Phosphorous and Arsenic) to form a continuous implant region that merges (i.e., extends entirely across) the N+ drain diffusion under the extension portion. The present inventors have found that superior two-channel NVM cells are produced by forming the floating gate on the thicker HV gate oxide, utilizing the HV-NLDD in read transistor and LV-LDD implants in the source/drain of the injection transistor, and generating the implant region under the extension portion using both LV-NLDD and HV-NLDD (or HV-NLDD only) processing steps. Alternatively, by slightly modifying the standard CMOS process flow to include one or two additional masks and utilizing process materials used in the standard CMOS process flow, NVM cells are produced that exhibit both shorter program times and shorter erase times.

In accordance with another aspect of the present invention, various drain region and floating gate configurations are used to optimize cell function and minimize cell size. In one embodiment, the first (read), second (injection) portions of the floating gate are connected to the third (drain) by fourth and fifth polysilicon portions such that a T-shaped polysilicon structure is formed. In another embodiment, the floating gate is patterned in a C-shaped structure with both the read and injection transistors located at the same side of the drain region. In yet other embodiments, the first and second floating gate portions are formed in a C-shaped or box-like O-shaped pattern such that two extension portions extend from read/injection transistors disposed at opposite sides of the drain region.

In accordance with another aspect of the present invention, the three-terminal NVM cells are arranged in arrays that facilitate cell operations while minimizing occupied chip space. In one embodiment, each NVM cell is connected between two bit lines and one word line, and program/erase operations are performed by applying programming voltages to the word line and one of the bit lines, while read operations are performed by applying a voltage to the word line and reading the other bit line.

In accordance with another embodiment of the present invention, a four-terminal NVM cell includes a PMOS injection transistor and an NMOS read transistor. The advantage of the described embodiment is low program currents.

BRIEF DESCRIPTION OF THE DRAWINGS

These and other features, aspects and advantages of the present invention will become better understood with regard to the following description, appended claims, and accompanying drawings, where:

FIGS. 6(A) and 6(B) are simplified plan views showing masks utilized during the fabrication of the two-channel NMOS NVM cell of FIG. 4 according to the process flow shown in FIG. 3;

FIGS. 7(A) and 7(B) are simplified plan views of the masks shown in FIGS. 6(A) and 6(B), respectively;

DETAILED DESCRIPTION OF THE DRAWINGS

The present invention relates to an improvement in embedded CMOS NVM cells. The following description is presented to enable one of ordinary skill in the art to make and use the invention as provided in the context of a particular application and its requirements. The terms "coupled" and "connected", when used alone herein, are defined as follows. The term "connected" is used to describe a direct connection between two circuit elements or structures, for example, by way of a conducting diffusion or metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). In contrast to "coupled" (alone), the phrases "capacitive coupling" and "capacitively coupled" indicates the transfer of voltage by means of the capacitance between two nodes or circuit structures. In addition, the term "region" is defined herein to describe a volumetric (threedimensional) area having substantially identical electrical properties and/or doping concentrations. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
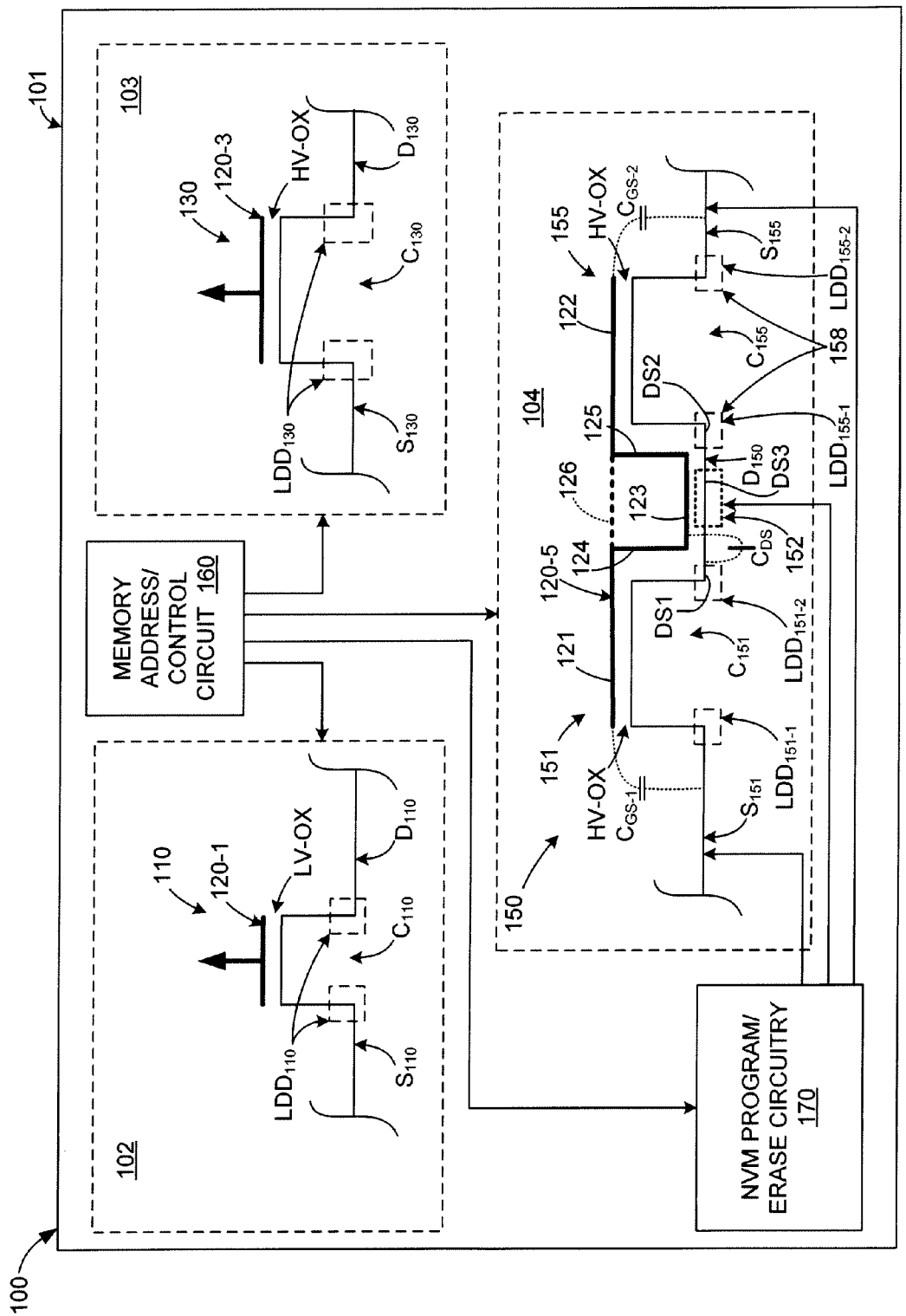
FIG. 1 is a simplified circuit diagram showing a CMOS IC including LV and HV MOSFETs and a two-channel NMOS NVM cell according to a generalized embodiment of the present invention.

FIG. 1 is a simplified circuit diagram showing a CMOS IC 100 including an LV MOSFET 110, an HV MOSFET 130, and a three-terminal (two-channel) NMOS NVM cell 150 that are all fabricated on a monocrystalline silicon "chip" 101 using either a standardized CMOS process or a substantially standardized (slightly modified) CMOS process flow, along with other circuit components that are omitted for brevity. HV MOSFET 130 is typically utilized to perform voltage conversion and other interface functions, and is therefore designed and fabricated for high external (system) operating voltages (e.g., 3.3V or 5V), and are typically located on exterior peripheral areas 103 of chip 101. In the 5V only designs HV MOSFET 130 may be located in the central area of the chip where LV MOSFET 110 are shown. NVM cell 150 is located in an area 104 that is located either in internal area 102, external area 103 or both, and serves to store control and/or data bits that are needed after power down.

Referring to the top left portion of FIG. 1, as is well known in the art, NMOS LV MOSFET 110 includes an N+ source region $S_{110}$ and an N+ drain region $D_{110}$ separated by a p-type channel region $C_{110}$. Formed over channel region $C_{110}$ is a polysilicon gate structure 120-1 that is separated from an upper surface of substrate 101 by a low-voltage gate oxide layer LV-OX. NMOS LV MOSFET 110 also includes low voltage n-type LDD regions $LDD_{110}$ having a first (relatively high) doping concentration that are connected to each of source region $S_{110}$ and drain region $D_{110}$ and extend into channel region $C_{110}$.

Referring to the top right portion of FIG. 1, as is also well known in the art, NMOS HV MOSFET 130 includes an N+ source region $S_{130}$ and an N+ drain region $D_{130}$ separated by a p-type channel region $C_{130}$. Formed over channel region $C_{130}$ is a polysilicon gate structure 120-3 that is separated from an upper surface of substrate 101 by a high-voltage gate oxide layer HV-OX. Note that high-voltage gate oxide layer HV-OX is typically thicker than low-voltage oxide layer LV-OX of LV MOSFET 110. NMOS HV MOSFET 130 also includes high-voltage n-type LDD regions $LDD_{130}$ having a second, relatively low doping concentration that are connected to each of source region $S_{130}$ and drain region $D_{130}$ and extend into channel region $C_{130}$.

The HV $LDD_{130}$ consists of a single implant only, while $LDD_{110}$ consists of two components—N-type and P-type. The second, P-type part of the LV NLDD implant is relatively strong and deep (to influence stronger P-wells of LV devices compared with HV transistors). A typical 40-50 keV $BF_2$ 6-8 $10^{13}/cm^2$ implant serves as a subsurface anti-punchthrough protecting in LV transistors. In the injection channel of the tree-terminal NVM cell it forms an abrupt p-n region with enhanced electrical field, thus facilitating the hot carrier generation)

Referring to the lower portion of FIG. 1, two-channel NVM cell 150 includes a "read" (first) floating gate NMOS transistor 151 having a read (first) source region $S_{151}$, an injection (second) transistor 155 having an injection (second) source region $S_{155}$, and a shared drain region $D_{150}$ that is separated from first source region $S_{151}$ by a first p-type channel region $C_{151}$, and separated from injection source region $S_{155}$ by a second p-type channel region $C_{155}$. Read source region $S_{151}$, injection source region $S_{155}$ and shared drain region $D_{150}$ are diffused into corresponding regions of substrate 101 using either known CMOS processing techniques or modified techniques discussed below. A high-voltage oxide layer HV-OX, which is substantially identical to that utilized by NMOS HV MOSFET 130 (discussed above) is formed over channel regions $C_{151}$ and $C_{155}$ and over drain region under the floating gate extension 123A in FIG. 4. A polysilicon floating gate 120-5 is shared by both read transistor 151 and injection transistor 155, and includes a first portion 121 that is at least partially disposed over read channel region $C_{151}$, a second portion 122 that is at least partially disposed over second channel region $C_{155}$, and a third portion 123 that is formed over drain region $D_{150}$. Third portion 123 of floating gate 120-5 is fabricated using techniques described below such that a gate-drain capacitance $C_{DS}$ between floating gate 120-5 and drain region $D_{150}$ is substantially (i.e., at least 4 times) higher than a first gate-source capacitance $C_{GS-1}$ between floating gate 120-5 and first source region $S_{151}$, and is substantially (i.e., at least four times) higher than a second gate-source capacitance $C_{GS-2}$ between floating gate 120-5 and second source region $S_{155}$. In particular, as indicated in FIG. 1, floating gate 120-5 includes a first portion 121 disposed over read channel region $C_{151}$ (i.e., such that first portion 121 is disposed adjacent to a first section DS1 of drain region $D_{150}$), a second portion 122 disposed over injection channel region $C_{155}$ (i.e., such that second portion 122 is disposed adjacent to a second section DS2 of drain region $D_{150}$, and a third portion 123 extending over a third section DS3 of drain region $D_{150}$. As described in the various specific embodiments below, floating gate 120-5 is an integral polysilicon structure that is etched from a single polysilicon layer (e.g., using a single photolithographic mask and etching step) such that, in at least one specific embodiment, first portion 121 is connected to third portion 123 either directly (i.e., third portion 123 is connected to and extends from first portion 121) or connected by an optional intermediate (fourth) portion 125, and such that second portion 122 is connected to third portion 123 either directly or by way of an optional intermediate (fifth) portion 125. As indicated by the dashed line connecting first portion 121 with second portion 122, in another alternative embodiment these portions may also be connected by an optional intervening sixth polysilicon structure 126. As such, floating gate 120-5 is formed such that when floating gate 120-5 is programmed, portions 121, 122 and 123 have the same potential (e.g., 4V), and when floating gate 120-5 is erased, portions 121, 122 and 123 also have the same potential (below ~0.5V).

Referring to the bottom portion of NVM cell 150, NVM cell 150 also includes first and second LDD regions $LDD_{155-1}$ and $LDD_{155-2}$ that are formed on each side of injection channel $C_{155}$ (i.e., first LDD region $LDD_{155-2}$ forms a portion of source region $S_{155}$, and second LDD region $LDD_{155-1}$ forms a portion of second section DS2 of drain region $D_{150}$), a third LDD region $LDD_{151-2}$ that forms a portion of first section DS1 of drain region $D_{150}$ and extends into read channel $C_{151}$, and a fourth LDD region $LDD_{151-1}$ that forms a portion of source region $S_{151}$ and extends into read channel $C_{151}$. In accordance with an aspect of the present invention, an implant region 152 is disposed under third section DS3 of drain region $D_{150}$, and comprises a sum of the same dopant and concentration as LDD regions $LDD_{130}$ of NMOS HV MOSFET 130 and region $LDD_{110}$ of NMOS LV MOSFET, correspondingly (discussed above). In particular, implant region 152 is formed using the dopants and concentrations of both NMOS LV MOSFET 110 and NMOS HV MOSFET 130 (i.e., dopant is diffused into implant region 152 during the formation of both $LDD_{110}$ and $LDD_{130}$) in order to facilitate the desired gate-to-drain capacitance $C_{DS}$.

Figure 2A:
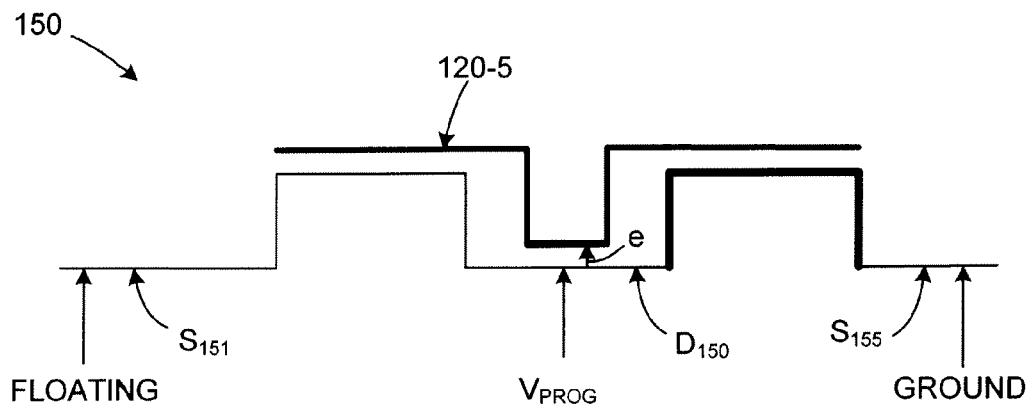
FIGS. 2(A), 2(B) and 2(C) are simplified circuit diagrams showing connections to the two-channel NMOS NVM cell of FIG. 1 during program, erase and read operations, respectively, according to an embodiment of the present invention.
Figure 2B:
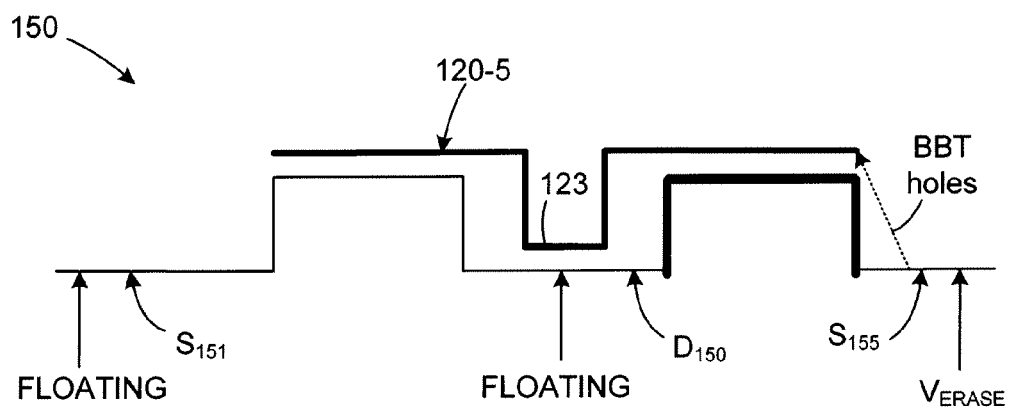
Figure 2C:
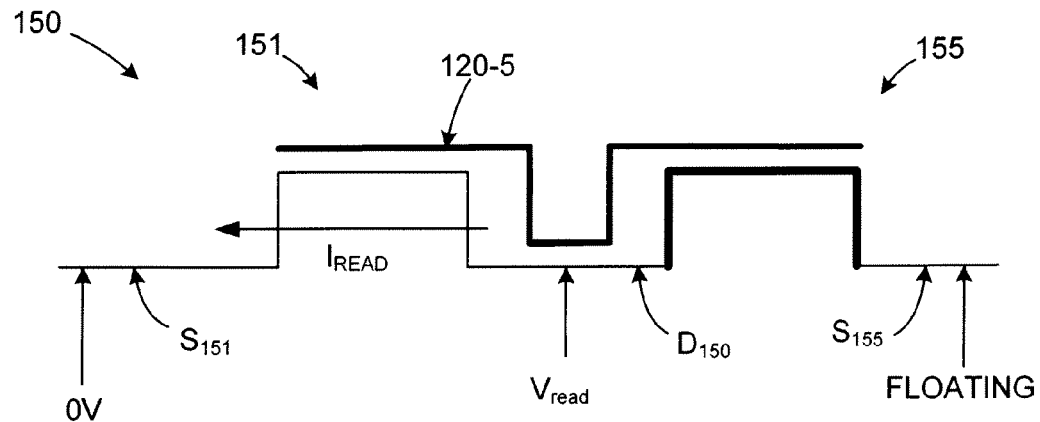

Referring again to FIG. 1, in addition to the above-described transistor types, CMOS IC 100 includes a memory address/control circuit 160 and NVM program/erase circuitry 170 that are utilized in the manner described below to access LV MOSFET 110 and HV MOSFET 130, and used for programming floating gate 120-5 of NVM cell 150 by transferring a positive programming potential from drain region $D_{150}$ to floating gate 120-5, and for erasing floating gate 120-5 by transferring an approximately zero volt potential from the drain region $D_{150}$ to the floating gate 120-5. FIGS. 2(A), 2(B) and 2(C) shown NVM cell 150 during program, erase and read operations, respectively, according to a specific embodiment. Referring to FIG. 2(A), floating gate 120-5 is programmed by applying a programming voltage $V_{PROG}$ to drain region $D_{150}$ and connecting injection source region $S_{155}$ to ground (read source $S_{151}$ is disconnected (floating)), which generates channel hot electrons that enter floating gate 120-5 from drain $D_{150}$. As indicated in FIG. 2(B), floating gate 120-5 is erased by applying an erase voltage $V_{ERASE}$ to injection source $S_{155}$ (drain region D and read source $S_{151}$ are disconnected (floating)), which initiates the injection of band-to-band tunneling (BBT) holes into floating gate 120-5 from injection source region $S_{155}$. As indicated in FIG. 2(C), read transistor 151 is used during read-out operations by applying a read voltage $V_{read}$ which is lower than the program voltage to drain region $D_{150}$ and coupling source read region $S_{151}$ to ground, while the injection source $S_{155}$ is floating, and measuring the resulting current $I_{read}$ flowing from drain to the "read" source (injection source region $S_{155}$ is disconnected). Note that CHE are not expressed in read transistor 151 due to the modifications discussed below because no additional implants on top of standard HV LDD implant are introduced in the read transistor in all presented embodiments, thus the read-disturb effects in NVM cell 150 are strongly suppressed compared with the one-channel (two-terminals) cell. It is clear to the skilled in the art that programming efficiency can be enhanced by applying bias to the body of the cell, which is equivalent to applying voltage to $S_{155}$ (e.g., 1-3V) while keeping the potential difference between $S_{155}$ and $D_{150}$ constant. Such an operation enhances CHISEL and allows lower programming currents.

Figure 3:
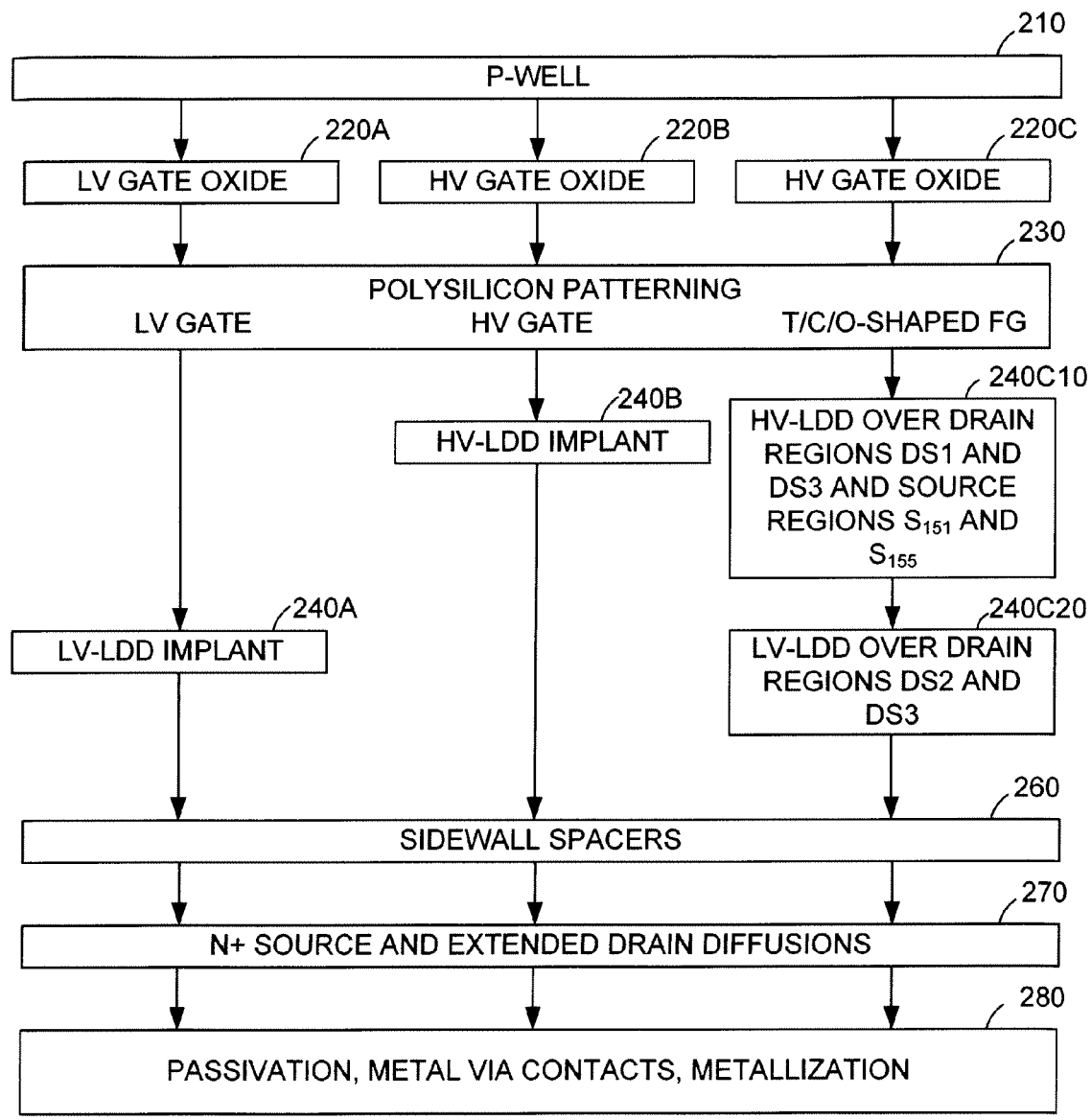
FIG. 3 is a flow diagram depicting a standard CMOS flow utilized to produce CMOS circuit of FIG. 1 according to another embodiment of the present invention.

According to an embodiment of the present invention, CMOS 100 is produced using a standardized CMOS process flow that is depicted in relevant part in FIG. 3. Fabrications steps that are not essential to describe the present invention, such as those utilized to produce p-type MOSFETs, are omitted for brevity. The CMOS process flow includes a process of forming P-well regions in substrate 101 (block 210) that define the boundaries of LV MOSFET 110, HV MOSFET 130 and NMOS cell 150. Referring to the left and central portions of FIG. 3, gate oxide layers are then formed on the upper surface of substrate 101 using separated processing steps. This gate oxide layer production includes forming a relatively thin gate oxide LV-OX (e.g., 30 Angstroms); step 220A) for LV MOSFET 110 and a relatively thick gate oxide HV-OX (e.g., 70 Angstroms; step 220B) for HV MOSFET 130. Next, a single polysilicon layer having a thickness of approximately 2000 Angstroms is formed and patterned using known techniques (block 230). Note that LV gate structure 120-1 of LV MOSFET 110 has a first (relatively narrow) gate line width (e.g., 0.14-0.18 µm (microns)) that is defined by the design rules (DR) of the standard CMOS process flow. In contrast, the HV gate structure 120-3 of HV MOSFET 130 has a second (relatively wide) gate line width (e.g., 0.35 µm) that is selected to facilitate high voltage operation. Following the polysilicon etch process, two separate LDD implants are performed using two masks and implant processes. LDD implants consist of combinations of donor and acceptor (pocket) implants. In particular, an LV-LDD implant (block 240A) is performed using a first mask to provide LDD regions $LDD_{110}$ of LV MOSFET 110, and an HV-LDD implant (block 240B) is performed using a second mask to provide LDD regions $LDD_{130}$ of HV MOSFET 130. Following the LV LDD and the HV LDD implant processes, sidewall spacers are formed on the polysilicon structures (block 260), and N+ source/drain region diffusions (block 270) are foamed in accordance with known techniques. Finally, first pre-metal dielectric, contacts, metallization, including interlayer dielectrics and metal vias, and passivation are performed according to known techniques.

Referring to the right side of FIG. 3, in accordance with an aspect of the present invention, according to the embodiment shown in FIG. 3, NVM cell 150 (FIG. 1) is entirely fabricated utilizing the existing LV and HV process steps of the standard CMOS process flow that are utilized to form LV MOSFET 110 and HV MOSFET 130. In particular, NVM cell 150 is produced using only the process steps of a standard CMOS process flow (i.e., no extra masks are required), which in turn facilitate the incorporation of NVM cell 150 into CMOS ICs without any additional manufacturing costs. As indicated on the right side of FIG. 3, source regions $S_{151}$ and $S_{155}$ and drain region $D_{150}$ of NVM cell 150 are formed using the same p-well process step (block 210) as that used to form LV MOSFET 110 and HV MOSFET 130. In addition, NVM cell 150 is produced using the same gate oxide HV-OX step (block 220C) that is used to form HV MOSFET 130. The single polysilicon layer used to form gates 120-1 and 120-3 is also patterned to form NVM cell 150 (step 230), with modifications to the floating gate shape being incorporated into the poly mask that are described in detail below. In accordance with an aspect of the present embodiment, NVM cell 150 is then subjected to the two standard LDD implant steps (blocks 240C10 and 240C20), where these LDD implant steps are characterized in that LDD (first diffusion)_region $LDD_{155-1}$ is formed using one of the two LDD implant processes (i.e., first diffusion region $LDD_{151-1}$ has the same doping concentration as that formed in one of LV MOSFET 110 in block 240A or HV MOSFET 130 in block 240B), and LDD (second diffusion) region $LDD_{155-2}$ is formed using the other LDD implant process (i.e., second diffusion region $LDD_{155-2}$ has the same doping concentration as that formed in the other of LV MOSFET 110 in block 240A or HV MOSFET 130 in block 240B), whereby the doping concentration of first diffusion region $LDD_{151-1}$ is different from the doping concentration of second diffusion region $LDD_{155-2}$). For example, as shown in FIG. 3, the LV-LDD implant step utilized for LV MOSFET 110 is used to form LDD region $LDD_{155-1}$ in drain region DS2 and to provide a first implant dose to second diffusion region 152 (block 240C20), and the HV-LDD implant step utilized for HV MOSFET 130 is used to form LDD regions $LDD_{151-1}$ and $LDD_{151-2}$ (i.e., regions extending into read channel $C_{151}$, where $LDD_{151-2}$ forms a part of drain region DS1; see FIG. 1), to form LDD region $LDD_{155-2}$ (i.e., a portion of source region $S_{155}$ extending into implant channel $C_{155}$; see FIG. 1), and to provide a second implant dose to second diffusion region 152 (see FIG. 3; block 240C10). As set forth below, by forming NVM cell 150 using the thicker HV gate oxide and utilizing both the LV-LDD and HV-LDD implant processes in the manner described above, the present invention facilitates forming implant region 152 that extends entirely under third portion DS3 of floating gate 120-5, whereby an optimal high drain field is provided in DS2 that facilitates CHE programming. In addition, the present inventors have found that forming the drain and source of injection transistor 155 using the LV-LDD and HV-LDD implant processes, respectively, produce an NVM cell in which programming times are faster (i.e., programming operations take less time), but erasing times are increased (i.e., erase is slower). In an alternative embodiment in which fast erase/slow programming is desired, the injection transistor LDD implants may be reversed from that shown in FIG. 3 (i.e., the LV-LDD implant used to form LDD region $LDD_{155\text{-}2}$ in source region $S_{151}$, and HV-LDD implant step utilized to form LDD region $LDD_{155\text{-}2}$ in drain region DS2; all other doped regions remain the same as that shown in FIG. 3). After the LDD implant steps are completed, floating gate 120-5 is then subject to the same sidewall spacer process (block 260), N+ source/drain diffusion process (block 270), metal via, and metallization processes (block 280) that are utilized in the fabrication of LV MOSFET 110 an HV MOSFET 130.

Figure 4:
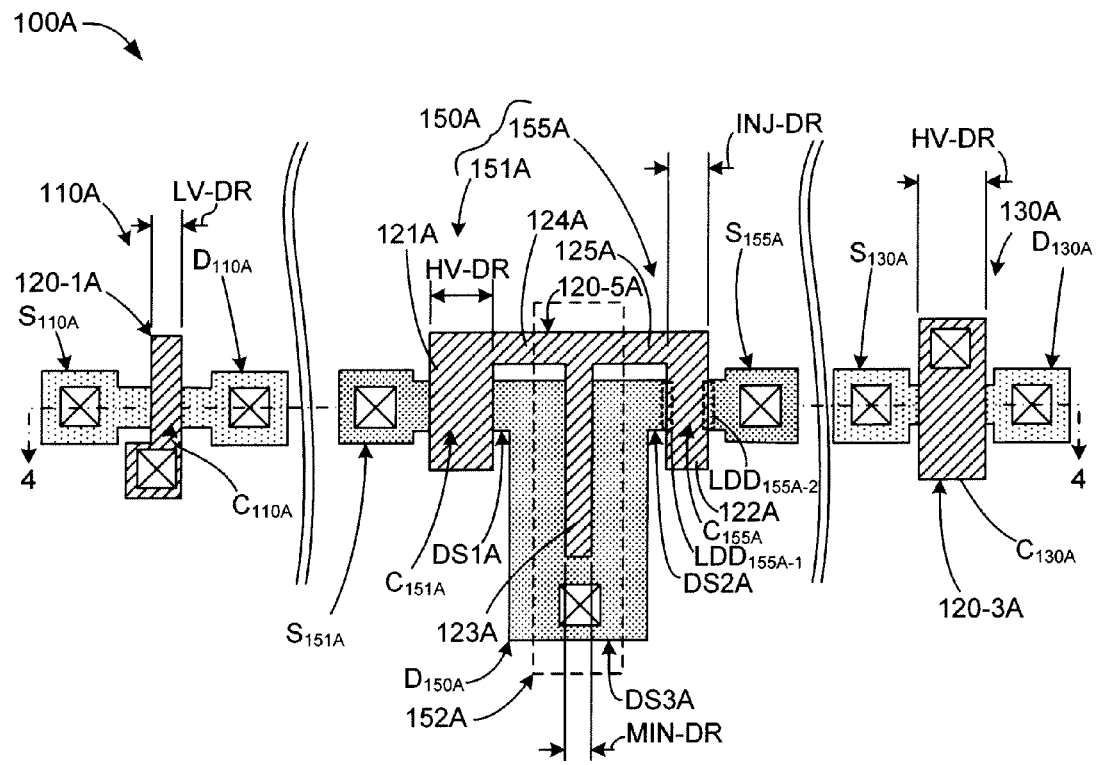
FIG. 4 is simplified top plan (layout) view showing portions of a CMOS IC including an exemplary three terminal (two-channel) NMOS NVM cell according to a specific embodiment of the present invention.
Figure 5:
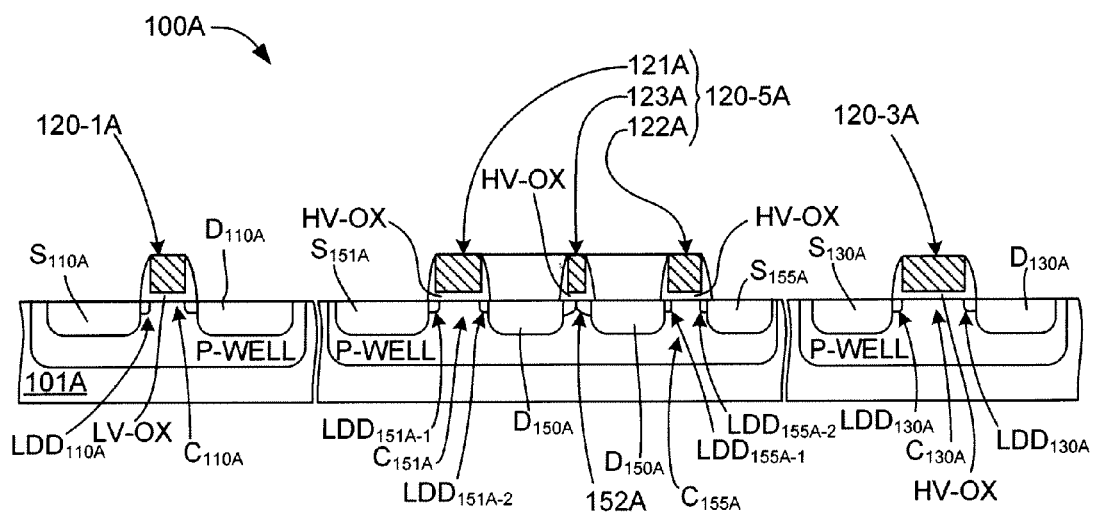
FIG. 5 is a cross-sectional side view showing the CMOS IC taken along section line 4-4 of FIG. 4.

FIGS. 4 and 5 are simplified plan and cross-sectional views showing an exemplary CMOS IC 100A fabricated on substrate 101A in accordance with a specific embodiment of the present invention. CMOS IC 100A including an LV MOSFET 110A, an HV MOSFET 130A, and a "T" shaped two-channel NMOS NVM cell 150A. Referring to the left side of FIGS. 4 and 5, LV MOSFET 110A includes an N+ source region $S_{110A}$ and an N+ drain region $D_{110A}$ separated by a p-type channel region $C_{110A}$, a polysilicon gate structure 120-1A formed on LV gate oxide layer LV-OX, and includes n-type LDD regions $LDD_{110A}$ that are connected to each of source region $S_{110A}$ and drain region $D_{110A}$ and extend into channel region $C_{110A}$. Referring to the right side of FIGS. 4 and 5, HV MOSFET 130A includes an N+ source region $S_{130A}$ and an N+ drain region $D_{130A}$ separated by a p-type channel region $C_{130A}$, a polysilicon gate structure 120-3A formed on HV gate oxide layer HV-OX, and includes n-type LDD regions $LDD_{130A}$. Referring to the central portions of FIGS. 4 and 5, three terminal NVM cell 150A includes a read NMOS transistor 151 having a source region $S_{151A}$, an injection NMOS transistor 155 having a source region $S_{155A}$, and an enlarged drain region $D_{150A}$ separated from source regions $S_{151A}$ and $S_{155A}$ by channel regions $C_{151A}$ and $C_{155A}$, respectively, and a shared polysilicon floating gate 120-5A that is formed on a gate oxide HV-OX. Referring to FIG. 5, NVM cell 150 also includes LDD regions $LDD_{151A\text{-}1}$, $LDD_{151A\text{-}2}$, $LDD_{155A\text{-}1}$ and $LDD_{155A\text{-}2}$ (formed using the HV-LDD implants and LV-LDD implants as described above with reference to blocks 240C10 and 240C20 of FIG. 3) that are connected to each of source regions $S_{151A}$ and $S_{155A}$ and drain region $D_{150A}$, respectively. In FIG. 4, the square boxes with internal "X" shapes designated contact structures used to provide electrical connection to the source/drain and gate structures of CMOS IC 100A.

In accordance with an aspect of the present embodiment, as shown in FIG. 4, floating gate 120-5A comprises a substantially T-shaped polysilicon structure including a first portion 121A disposed over channel region $C_{151A}$, a second portion 122A disposed over channel region $C_{155A}$, and a third portion 123A extending parallel to first portion 121A and extending over a central area of enlarged drain region $D_{150A}$, a fourth portion 124A that is connected between respective ends of first portion 121A and third portion 123A, and a fifth portion 125A that is connected between respective ends of second portion 122A and third portion 123A. Note that fourth portion 124A and fifth portion 125A are disposed over areas located outside of the boundaries of channel regions $C_{151A}$ and $C_{155A}$ and drain region $D_{150A}$. First portion 121A has a gate line width defined by the high voltage design rule (HV-DR) of the standardized CMOS process flow (i.e., first portion 121A has the same width as gate 120-3A of HV MOSFET 130A). Second portion 122A has a width INJ-DR (between LV-DR and HV-DR) in order to enhance the CHE programming but not to cause channel leakage (e.g., in the range from 0.18 um to 0.35 um). Third portion 123A has a width defined by the minimum design rule (MIN-DR) width of the standardized CMOS process flow. In one specific embodiment, using a 0.18 micron CMOS process flow, the width of third portion 123A is 0.14 microns. The relatively large width of first portion 121A is required to support the read-out potentials that are generated between source region $S_{151A}$ and drain region $D_{150A}$ (across channel region $C_{151A}$) without read disturb. In contrast, third portion 123A is not subject to the operating constraints and potentials of first portion 121A, and therefore is made narrower than first portion 121A in order to save space and increase capacitance to the floating gate (due to merging of NLDD implant under its narrow polycrystalline silicon (polysilicon) structure).

In accordance with another aspect of the present embodiment, NVM cell 150A includes both LV-LDD and HV-LDD implants formed during the respective LV-LDD and HV-LDD implant process steps, which are illustrated in relevant part in top and cross-sectional side views in FIGS. 6(A), 6(B), 7(A) and 7(B) as described below. Referring to FIG. 6(A), the positions of source region $S_{151A}$, drain region $D_{150A}$, source region $S_{155A}$, channel regions $C_{151A}$ and $C_{155A}$, and floating gate 120-5A are indicated in dashed lines for reference. As indicated in FIGS. 6(A) and 7(A), a first mask 310 used during the HV-LDD implant process (see blocks 240A and 240C10 of FIG. 3) defines a first opening $311_{151}$ that is positioned over and exposes the source region $S_{151A}$, a second opening $311_{155}$ that is positioned over and exposes the source region $S_{155A}$, and a third opening $311_{150}$ that is positioned over and exposes drain regions DS1A and DS3A, whereby HV-LDD implant material 312 is diffused into these regions during the LDD implant process (note that drain region DS2A is covered by mask 310, thereby preventing diffusion of material 312 in this region). Similarly, as indicated in FIGS. 6(B) and 7(B), a second mask 320 used during the LV-LDD process defines a first opening $321_{150}$ that is positioned over and exposes drain regions DS2A and DS3A in order to facilitate diffusion of LV-LDD implant material 322 into drain region DS3A (implanted region 152A) and drain region DS2A (note that drain region DS1A, source region $S_{151A}$ and source region $S_{155A}$ are covered by mask 320, thereby preventing diffusion of LV-LDD material 322 in these regions). As shown in FIGS. 7(A) and 7(B), during the HV-LDD and LV-LDD implant processes, the mask opening $311_{150}$ and $321_{150}$ respectively produce both LV-LDD implant material and HV-LDD implant material in third drain region DS3A (i.e., implanted region 152A). As such, implanted region 152A has the sum of both HV-LDD and LV-LDD doping concentrations of LDD regions $LDD_{110A}$ and $LDD_{130A}$, which are shown in FIG. 5 and are produced during the LV-LDD and HV-LDD implant processes, respectively. The present inventors have found that superior three-terminal (two-channel) NVM cells are produced by forming floating gate 120-5A on the relatively thick HV gate oxide such that second gate portion 123A has the minimal width set by the LV-DR, using HV-LDD implants in the source regions $S_{151A}$ and $S_{155A}$ and drain region DS1A, and generating implant region 152A in drain region DS3A under third portion 123A using both the LV-LDD and HV-LDD implants. This combination of processes are believed to form implant region 152A such that it merges under (i.e., extends entirely under) third portion 123A, as depicted in FIG. 4, whereby implant region 152A extends between opposing edges of N+ drain region $D_{150A}$ that are located below opposing side edges of third portion 123A.

In accordance with another aspect of the present embodiment, NVM cell 150A is programmed using channel hot electron (CHE) injection and erased using band-to-band tunneling (BBT) holes. During programming, a positive programming voltage (e.g., 5V-6V is applied to drain region $D_{150A}$ and injection source region $S_{155A}$ is connected to ground (0V), and read source region S151A is floating, thereby causing CHE injection from channel drain region $D_{150}$ into the floating gate 120-5A. In one embodiment, the programming process is enhanced by applying a body bias voltage (e.g., from −1 to −5V to the P-well in which injection transistor 155 is formed). In one specific embodiment, the body bias from −3V to −5V voltage is applied to the isolated P-well containing channel region $C_{155A}$ with a delay period of 1 to 100 μS (100 microseconds) after asserting the programming voltages 4.5V to drain region $D_{150A}$ and coupling source region $S_{155A}$ to ground. Erase operations are performed by keeping the drain region $D_{150A}$ and read source region S151A floating and applying the positive erase voltage to source region $S_{155A}$, thereby causing BBT generation of holes in the region $S_{155A}$, their acceleration in the field of source junction and tunneling into the floating gate 120-5A.

Referring again to FIG. 1, although the embodiment described above with reference to FIGS. 3-7 provides a desirable method for producing NVM cell 100 without the need for an additional mask or process steps (i.e., NVM cell 100 is fabricated entirely using a standard CMOS process flow), the present inventors have determined that by forming NVM cell 100 with an optional CHE enhancing implant 158 (e.g., boron-difluoride ($BF_2$)) provided in drain diffusion region $LDD_{155-1}$ and source diffusion region $LDD_{155-2}$ of injection transistor 155, NVM cell 100 can be produced with shorter CHE programming and BBT erase operation times. In addition, the present inventors have determined that optimal CHE enhancing implants 158 can be produced by adding a small number of masks (e.g., one or two) and associated process steps into a standard CMOS process flow without disrupting the operation of the other CMOS elements, and while utilizing the materials used during the standard CMOS process flow. Examples of these alternative methods and resulting NVM cells are described below with reference to FIGS. 8-13.

Figure 8:
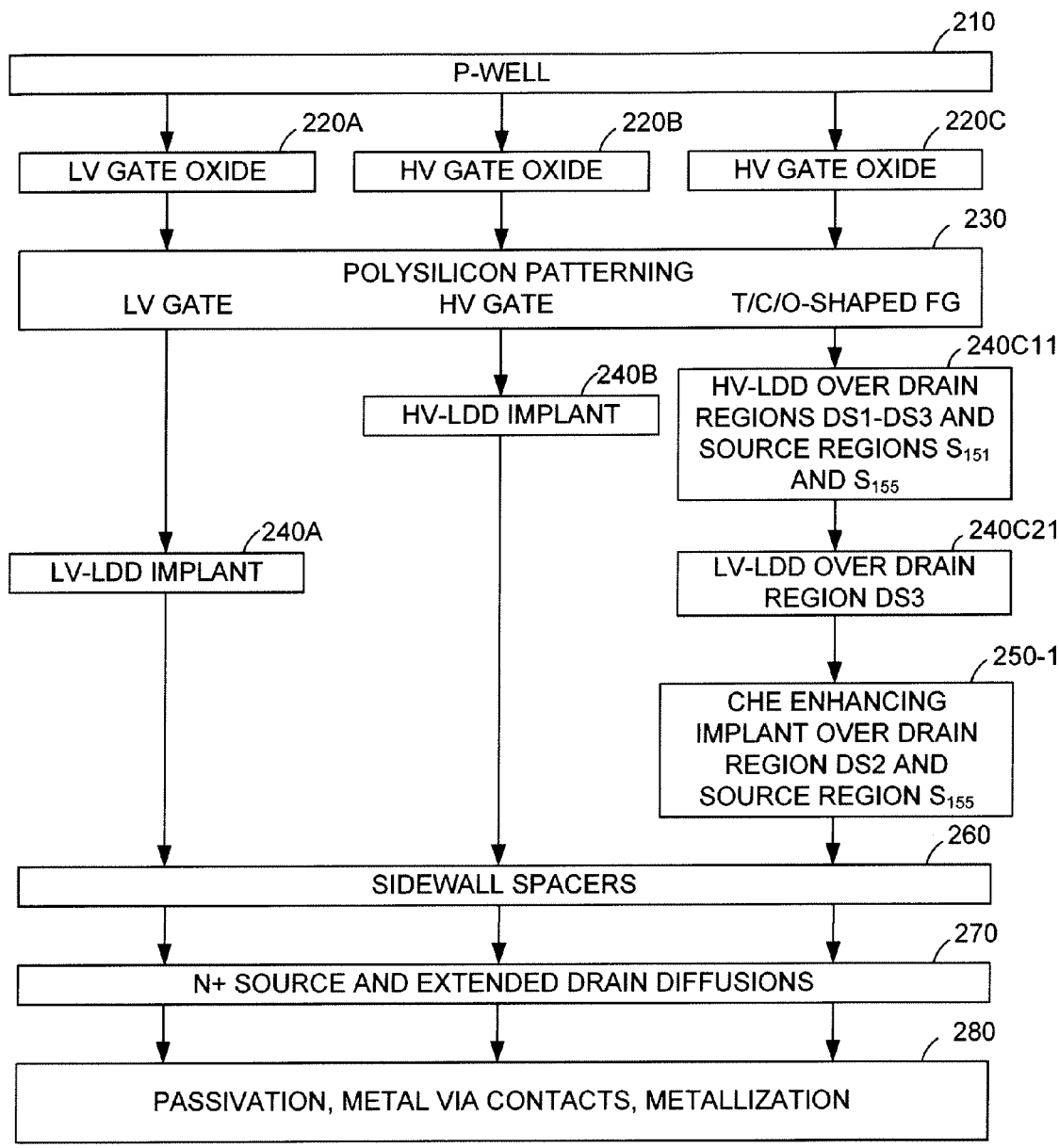
FIG. 8 is a flow diagram depicting a modified CMOS flow utilized to produce CMOS circuit of FIG. 4 according to an alternative embodiment of the present invention.

FIG. 8 shows a modified CMOS process flow according to a first alternative embodiment of the present invention. Similar to the process flow shown in FIG. 3 (described above), fabrications steps that are not essential to describe the present invention are omitted for brevity. FIG. 8 repeats the process portions of the standard CMOS process flow (see FIG. 3) that are associated with the fabrication of LV MOSFET 110 (i.e., blocks 210, 220A, 230, 240A, 260, 270 and 280) and HV MOSFET 130 (i.e., blocks 210, 220B, 230, 240B, 260, 270 and 280) for context, and details of these steps are understood to be essentially identical to those described above and will therefore not be repeated here for brevity. In addition, process portions of the standard CMOS process flow (see FIG. 3) associated with the fabrication of NVM cell 150 that are utilized in the modified CMOS process flow of FIG. 8 (e.g., blocks 210, 220C, 230, 260, 270 and 280) are understood to be essentially identical to those described above, and details of these processes will therefore also not be repeated here for brevity.

Referring to the central right side of FIG. 8, the modified CMOS process flow of FIG. 8 is similar to the standard CMOS process flow of FIG. 3 in that, after polysilicon patterning (block 230), portions of NVM cell 150 are formed using the two standard LDD implant steps (blocks 240C11 and 240C21). However, in this embodiment, the HV-LDD process is utilized to implant HV-LDD material into the entire area of drain $D_{150}$ (i.e., in each of drain regions DS1, DS2 and DS3) and also in both source regions $S_{151}$ and $S_{155}$ (see block 240C11), and then the LV-LDD process is utilized to implant LV-LDD material only into drain region DS3 of drain $D_{150}$ (i.e., in implanted region 152; see block 240C21). According to the present embodiment, an additional mask is then utilized to form CHE enhancing implants 158 (block 250) in drain region DS2 and source region $S_{155}$, thereby providing the enhanced injection transistor structure described above.

FIGS. 9(A) to 9(C) and 10(A) to 10(C) are top and cross-sectional side views illustrating masks and associated Processes performed in accordance with blocks 240C11, 240C21 and 250 of FIG. 8 according to an exemplary embodiment associated with the fabrication of NVM cell 100A (described above with reference to FIGS. 4 and 5). These figures show the positions of source region $S_{151A}$, drain region $D_{150A}$, source region S155A, and the floating gate for reference using dashed lines in the manner described above with reference to FIG. 6(A).

Figure 9A:
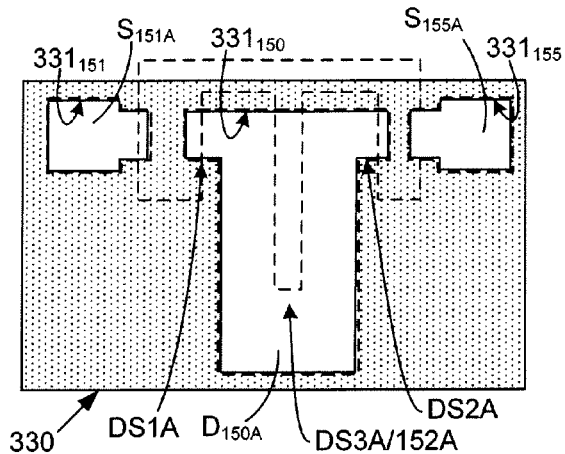
FIGS. 9(A), 9(B) and 9(C) are simplified plan views showing masks utilized during the fabrication of the two-channel NMOS NVM cell of FIG. 4 according to the process flow shown in FIG. 8.
Figure 10A:
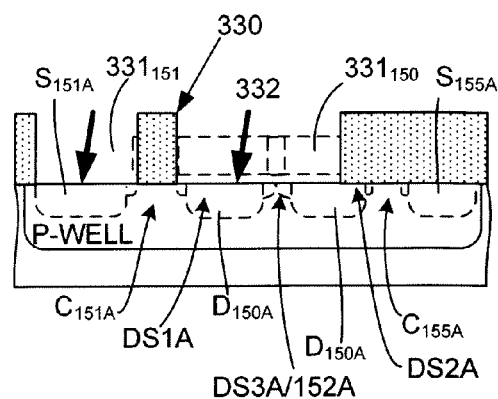
FIGS. 10(A), 10(B) and 10(C) are simplified plan views of the masks shown in FIGS. 9(A), 9(B) and 9(C), respectively.
Figure 9B:
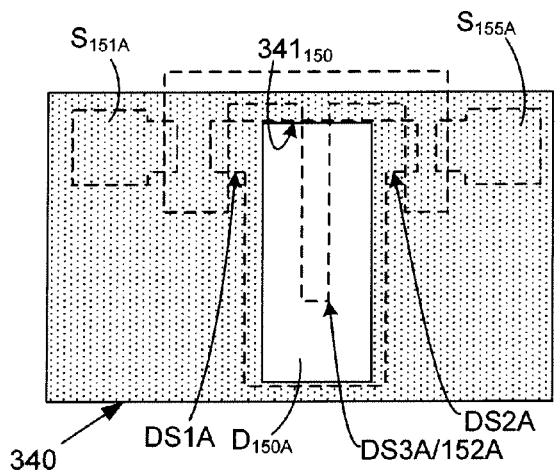
Figure 10B:
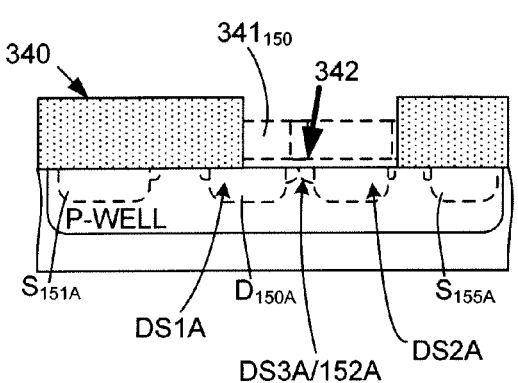
Figure 9C:
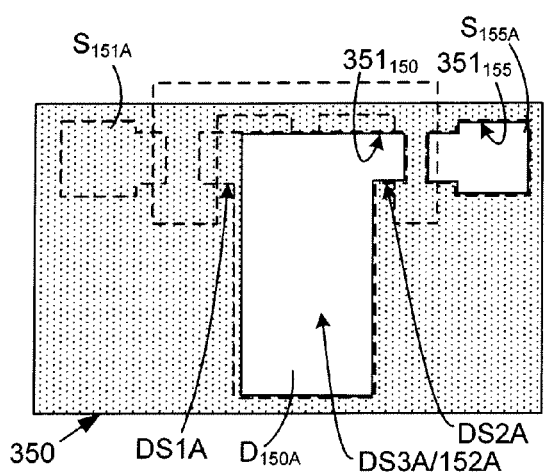
Figure 10C:
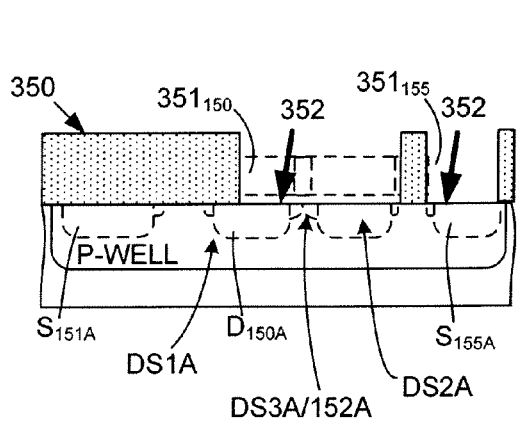

As indicated in FIGS. 9(A) and 10(A), a first mask 330 used during the HV-LDD implant process (see blocks 240A and 240C11 of FIG. 8) defines a first opening $331_{151}$ that is positioned over and exposes the source region $S_{151A}$, and a second opening $331_{150}$ that is positioned over and exposes drain regions DS1A, DS2A and DS3A, and a third opening $331_{155}$ that is positioned over and exposes the source region $S_{155A}$, whereby HV-LDD implant material 332 is diffused into these regions during the LDD implant process. Next, as indicated in FIGS. 9(B) and 10(B), a second mask 340 used during the LV-LDD process defines an opening $341_{150}$ that is positioned over and exposes drain region DS3A, whereby this opening facilitates diffusion of LV-LDD implant material 342 into drain region DS3A (implanted region 152A; note that drain regions DS1A and DS2A and source regions $S_{151A}$ and $S_{155A}$ are covered by mask 340, thereby preventing diffusion of LV-LDD material 342 in these regions). Finally, as indicated in FIGS. 9(C) and 10(C), an "extra" mask 350 is used during the non-standard CHE enhancing implant process (see block 250 of FIG. 8), where mask 350 defines a first opening $351_{151}$ that is positioned over and exposes the source region $S_{151A}$, and a second opening $331_{150}$ that is positioned over and exposes drain region DS3A, whereby a CHE enhancing implant material 352 (e.g., $BF_2$ applied with an energy in the range of 20 to 140 Key and at an angle in the range of 0 to 45°) is diffused into these regions (note that source region $S_{151A}$ and drain regions DS1A and DS3A are covered by mask 330, thereby preventing diffusion of CHE enhancing material 352 in these regions). According to the process illustrated in FIGS. 9(A) to 9(C) and 10(A) to 10(C), the LDD portion of drain region DS2A (first diffusion region) and the LDD portion of source region $S_{155A}$ (second diffusion region) include a sum of the HV-LDD doping concentration applied with material 342 and CHE implant material 352, whereby the resulting injection transistor is fabricated to exhibit the enhanced program/erase functions mentioned above. Following the CHE enhancing implant, the standard CMOS process flow (see FIG. 8) is resumed.

Figure 11:
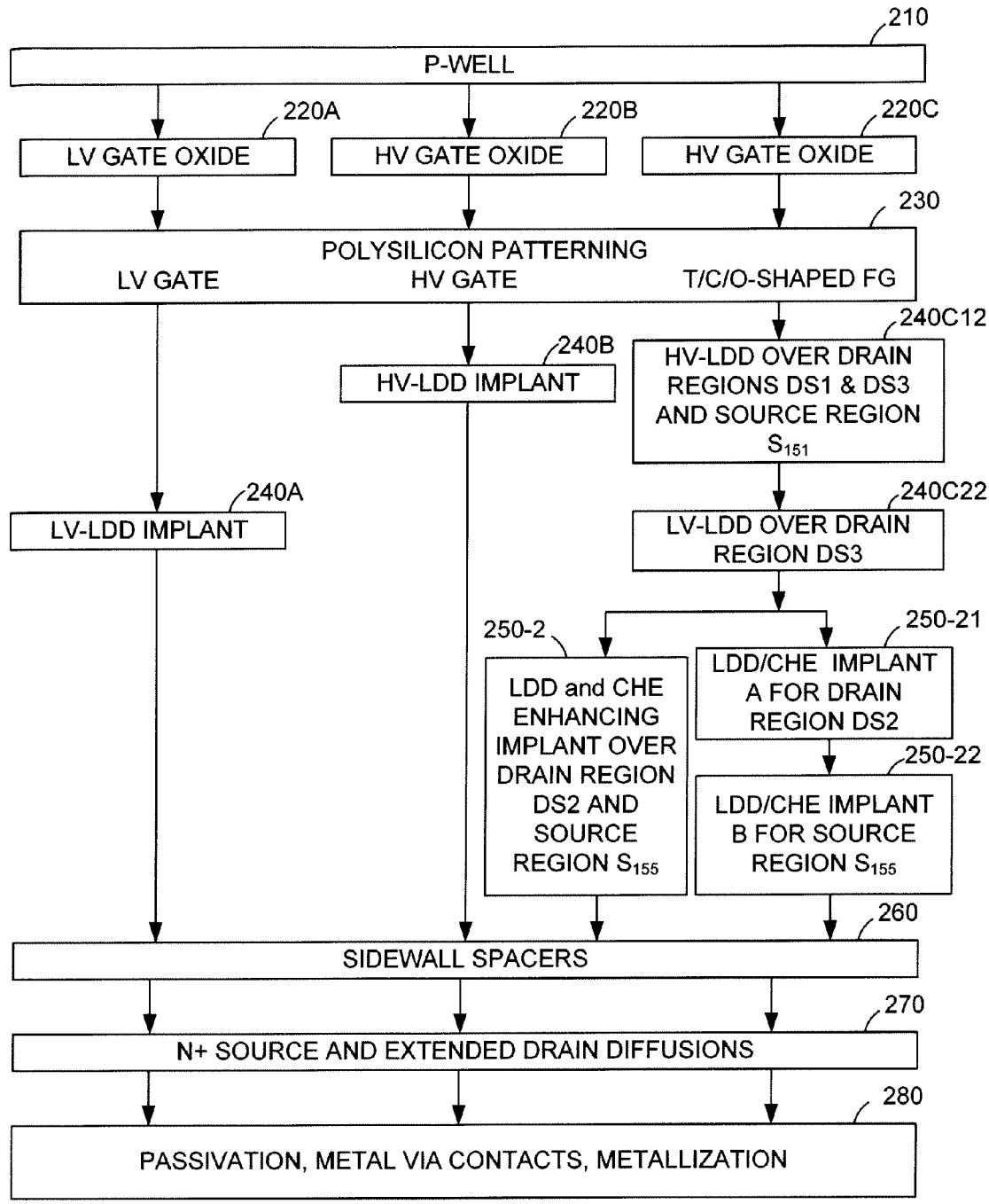
FIG. 11 is a flow diagram depicting a modified CMOS flow utilized to produce CMOS circuit of FIG. 4 according to yet another alternative embodiment of the present invention.

FIG. 11 shows a modified CMOS process flow according to a second alternative embodiment of the present invention. Similar to the process flow shown in FIG. 8 (described above), fabrications steps that are not essential to describe the present invention are omitted for brevity, and process portions of the standard CMOS process flow are repeated for context, but details of these steps are understood to be essentially identical to those described above and will therefore not be repeated here for brevity.

Referring to the central right side of FIG. 11, the modified CMOS process flow of FIG. 11 is similar to the standard CMOS process flow of FIG. 3 in that, after polysilicon patterning (block 230), the read transistor and implanted region 152 of NVM cell 150 are formed using the two standard LDD implant steps (blocks 240C12 and 240C22). That is, the HV-LDD process is utilized to implant HV-LDD material into only in regions DS1 and DS3 of drain $D_{150}$, and also in source region $S_{151}$ (see block 240C12), and then the LV-LDD process is utilized to implant LV-LDD material only into drain region DS3 of drain $D_{150}$ (i.e., in implanted region 152; see block 240C22). According to alternative variations of the present embodiment, either one additional mask (block 250-2) or two additional masks (blocks 250-21 and 250-22) are then utilized to form CHE enhancing implants 158 in drain region DS2 and source region $S_{155}$, thereby providing the enhanced injection transistor structure described above. These variations are explained in additional detail with reference to the example provided below.

Figure 12A:
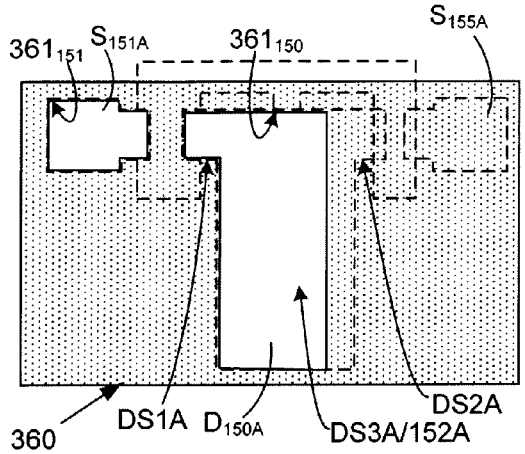
FIGS. 12(A), 12(B), 12(C), 12(D) and 12(E) are simplified plan views showing masks utilized during the fabrication of the two-channel NMOS NVM cell of FIG. 4 according to the process flow shown in FIG. 11.
Figure 13A:
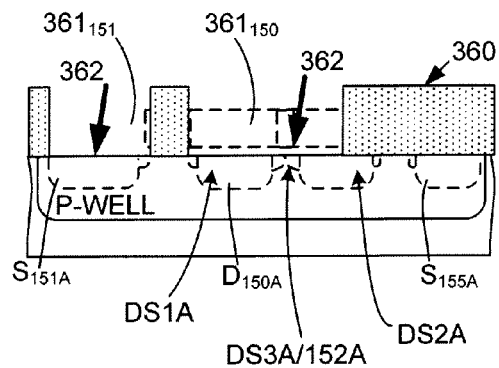
FIGS. 13(A), 13(B), 13(C), 13(D) and 13(E) are simplified plan views of the masks shown in FIGS. 12(A)-12(E), respectively.
Figure 12B:
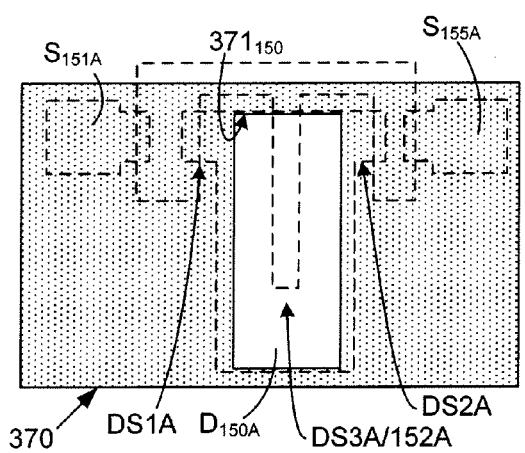
Figure 13B:
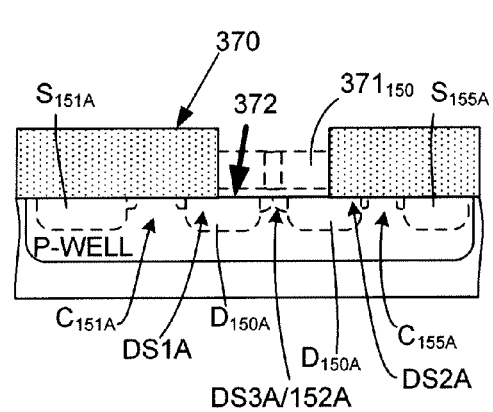

FIGS. 12(A), 12(B), 13(A) and 13(B) are top and cross-sectional side views illustrating masks and associated processes performed in accordance with blocks 240C12 and 240C22 of FIG. 11 according to an exemplary embodiment associated with the fabrication of NVM cell 100A (described above with reference to FIGS. 4 and 5). These figures show the positions of source region $S_{151A}$, drain region $D_{150A}$, source region S155A, and the floating gate for reference using dashed lines in the manner described above with reference to FIG. 6(A). As indicated in FIGS. 12(A) and 13(A), a first mask 360 used during the HV-LDD implant process (see blocks 240A and 240C12 of FIG. 11) defines a first opening $361_{151}$ that is positioned over and exposes the source region $S_{151A}$, and a second opening $361_{150}$ that is positioned over and exposes drain regions DS1A and DS3A, whereby HV-LDD implant material 362 is diffused into these regions during the HV-LDD implant process. Similarly, as indicated in FIGS. 12(B) and 13(B), a second mask 370 used during the LV-LDD process defines a first opening $371_{150}$ that is positioned over and exposes drain region DS3 to facilitate diffusion of LV-LDD implant material 372 into drain region DS3A (implanted region 152A).

Figure 12C:
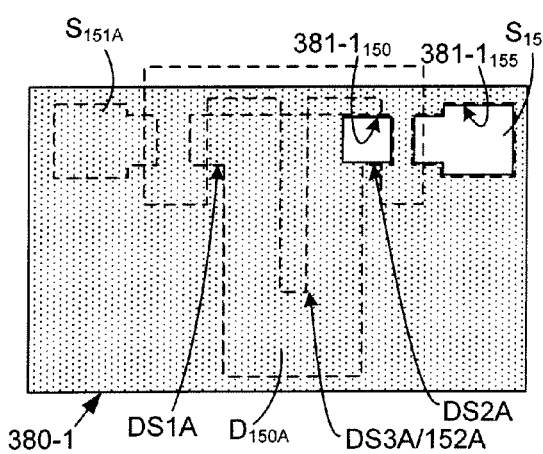
Figure 13C:
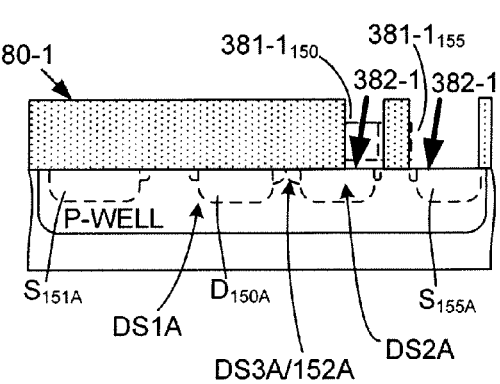

FIGS. 12(C) and 13(C) illustrate the single-mask variation of the present embodiment associated with block 250-2 of FIG. 11. In this variation, an "extra" mask 380-1 is formed with a first opening $381-1_{150}$ that is positioned over and exposes drain region DS3A, and a second opening $381-1_{155}$ that is positioned over and exposes the source region $S_{155A}$. As indicated in FIG. 13(C), "extra" mask 380-1 is during a special implant process involving diffusion of material 382-1 (e.g., a combination (sum) of the N-type part of the LV-LDD implant performed in block 240A and a CHE enhancing implant (e.g., BF$_2$ applied with an energy in the range of 20 to 140 KeV and at an angle in the range of 0 to 45°) that are sequentially applied through openings $381-1_{150}$ and $381-1_{155}$ into region DS3A and source region $S_{155A}$. According to the variation illustrated in FIGS. 12(C) and 13(C), the LDD portion of drain region DS2A (first diffusion region) and the LDD portion of source region $S_{155A}$ (second diffusion region) include a sum of the selected (third) LDD doping concentration and the CHE implant material, whereby the injection transistor 155A exhibits the enhanced program/erase functions mentioned above.

Figure 12D:
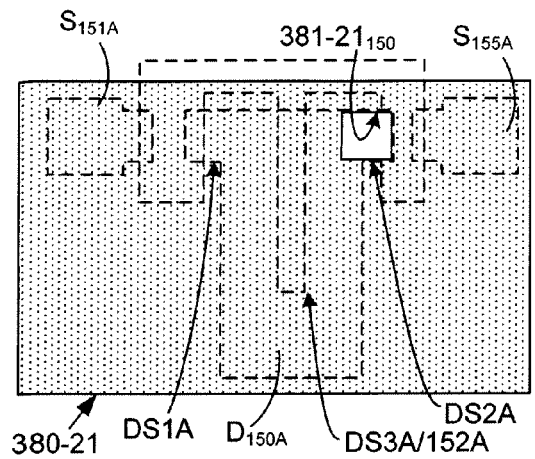
Figure 13D:
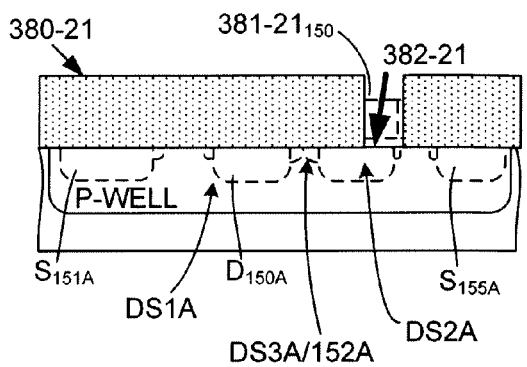
Figure 12E:
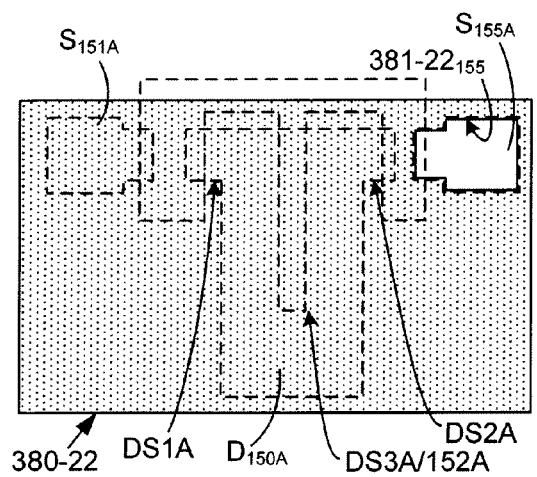
Figure 13E:
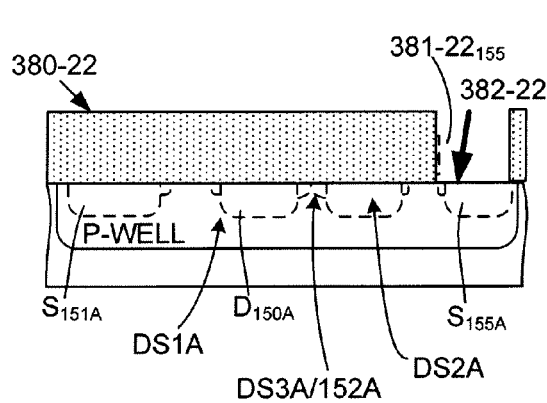

FIGS. 12(D), 12(E), 13(D) and 13(E) illustrate the two-mask variation of the present embodiment associated with block 250-21 and 250-22 of FIG. 11. In this variation, as shown in FIGS. 12(D) and 13(D), a first "extra" mask 380-21 is formed with an opening $381-21_{150}$ that is positioned over and exposes drain region DS3A (source region $S_{155A}$ remains masked), and a first material 382-21 (e.g., a combination of the N-type part of the LV-LDD implant performed in block 240A and a CHE enhancing implant (e.g., BF$_2$ applied with an energy in the range of 20 to 140 KeV and at an angle in the range of 0 to 45°) that are sequentially applied through opening $381-21_{150}$ into region DS3A. First "extra" mask 380-21 is then removed, and then, as shown in FIGS. 12(E) and 13(E), a second "extra" mask 380-22 is formed with an opening $381-22_{155}$ that is positioned over and exposes source region $S_{155A}$ (drain region DS3A remains masked), and a second material 382-21 (e.g., a combination of the N-type part of the LV-LDD implant performed in block 240A and a CHE enhancing implant (e.g., BF$_2$ applied with an energy in the range of 20 to 140 KeV and at an angle in the range of 0 to 45°) that are sequentially applied through opening $381-22_{155}$ into source region $S_{155A}$. According to the variation illustrated in FIGS. 12(D/E) and 13(D/E), the LDD portion of drain region DS2A (first diffusion region) and the LDD portion of source region $S_{155A}$ (second diffusion region) include a sum of two selected (third and fourth) LDD doping concentrations and the CHE implant material, whereby the injection transistor 155A exhibits both enhanced program and programmed erase functions.

The present inventors have determined through experimental observation that forming the CHE enhancing implants utilized in the variations set forth above by implanting BF$_2$ using an implant energy that is increased from the 40 keV (which is normally utilized in standard CMOS process flow LDD implants) to 80 keV significantly reduced programming times and provides several other advantages such as reduced programming current (i.e., higher hot electron generation efficiency). First, CHE programming time was found to decrease from 10 ms (in the absence of the CHE enhancing implant) to approximately 2 ms for the same programming voltage, thereby providing substantially shorter programming times. In addition, the maximum allowable programming voltage was found to increase from approximately 6.5V to approximately 7V. Further, because no remarkable changes in programming current were detected, and because the cell was able to operate at the higher (approximately 7V) programming voltage, the CHE enhancing implant facilitates reducing the channel length $L_{INJ}$ from 0.3 µm to 0.24 µm to achieve additional improvement in programming time. Finally, by utilizing an implant energy of 80 keV and using a channel length $L_{INJ}$=0.24 µm, programming time was further reduced to about 1 ms.

Forming CHE enhancing implants by implanting the BF$_2$ at 80 keV was also found to provide improved erase times as well. The inventors observed that the erase times were decreased by about one order of magnitude for erase voltages of 6.5V. The Source junction avalanche occurs at lower voltage in case of "80 keV" flavor (~7V instead ~8.5V). Erase by avalanche mechanism is fast, but is considered to be more harmful than BTB. The recommended maximal erase voltage was found to be 7V.

The various cell fabrication methods set forth above are not limited to NVM cell 100A (shown in FIGS. 4 and 5), and those skilled in the art will recognize that the methods and diffusion patterns set forth above may be incorporated into NVM cells having other gate arrangements, such as those described below with reference to FIGS. 14-16.

Figure 14:
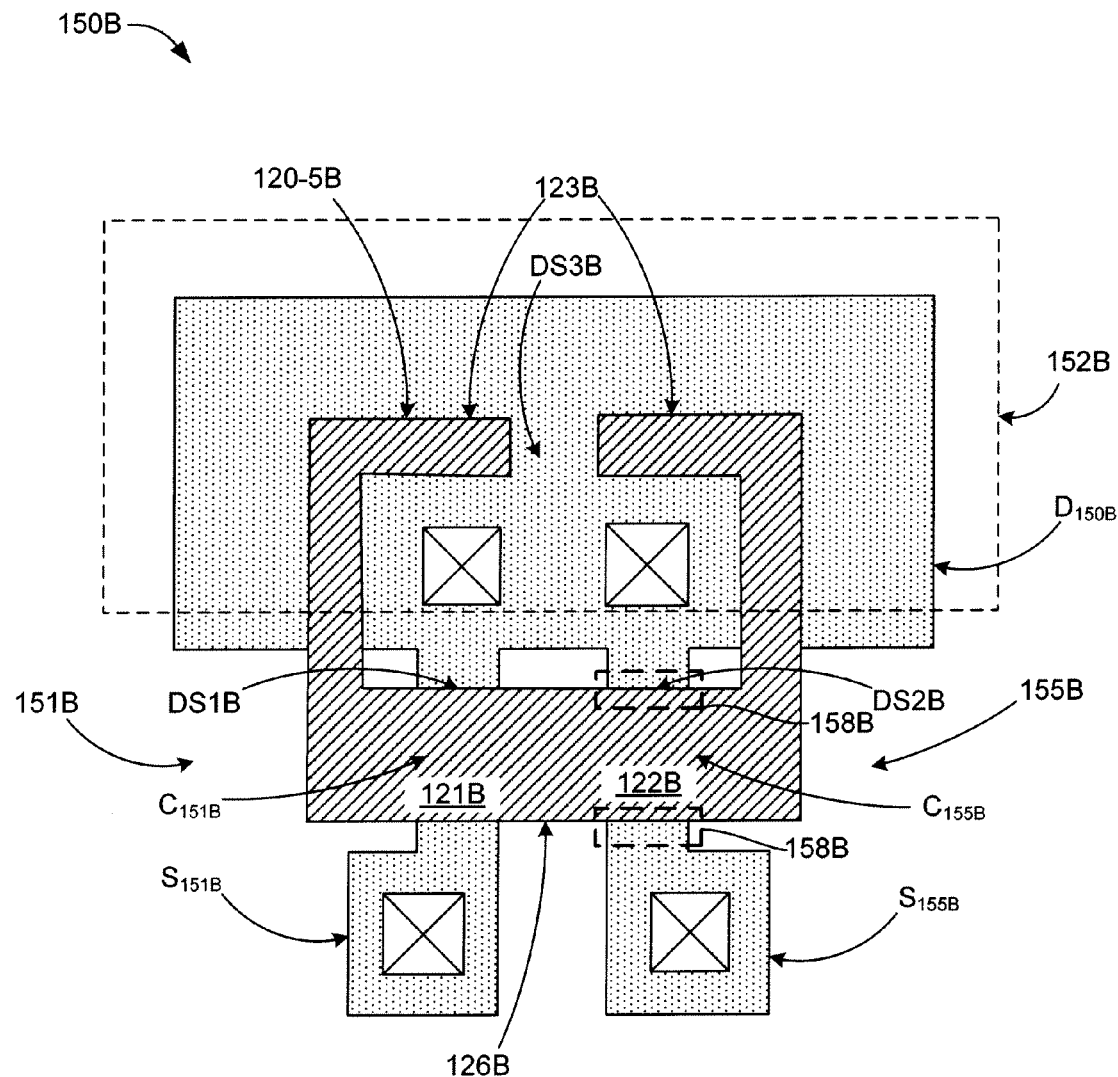
FIG. 14 is simplified top plan (layout) view showing a three terminal NMOS NVM cell according to another specific embodiment of the present invention.

FIG. 14 is simplified top plan view showing a three-terminal "C" or "horseshoe" shaped NMOS NVM cell 150B according to another specific embodiment of the present invention. NVM cell 150B is formed as part of a CMOS IC, similar to that described above, which includes both LV MOSFETs and HV MOSFETs, which are omitted from the discussion below for brevity. Similar to NVM cell 150A (discussed above), NVM cell 150B includes a read NMOS transistor 151B having a source region $S_{151B}$, an injection NMOS transistor 155B having a source region $S_{155B}$, and an enlarged drain region $D_{150B}$ separated by a channel region $C_{151B}$ from source region $S_{151B}$ and by a channel region $C_{155B}$ from source region $S_{155B}$, and a polysilicon floating gate 120-5B. Floating gate 120-5B is similar to floating gate 120-5A (discussed above) in that it is formed on an HV oxide (not shown), and includes a first portion 121B disposed over channel region $C_{151B}$ and adjacent to a first section DS1B of drain region $D_{150B}$, a second portion 122B disposed over channel region $C_{155B}$ and adjacent to a second section DS2B of drain region $D_{150B}$, and third portions 123B disposed over an enlarged third section DS3B of drain region $D_{150B}$. Note that floating gate 120-5B differs from floating gate 120-5A (discussed above) in that two portions 123B extend from first portion 121B and second portion 122B over drain region D150B, respectively, and first and second portions 121B and 122B are directly connected by a (sixth) portion 126B. NVM cell 150B is subjected to the LDD implant processes in the manner described above to facilitate the formation of drain implant 152B and optional CHE enhancing implant regions 158B similar to those described above with reference to FIGS. 8-13.

Figure 15:
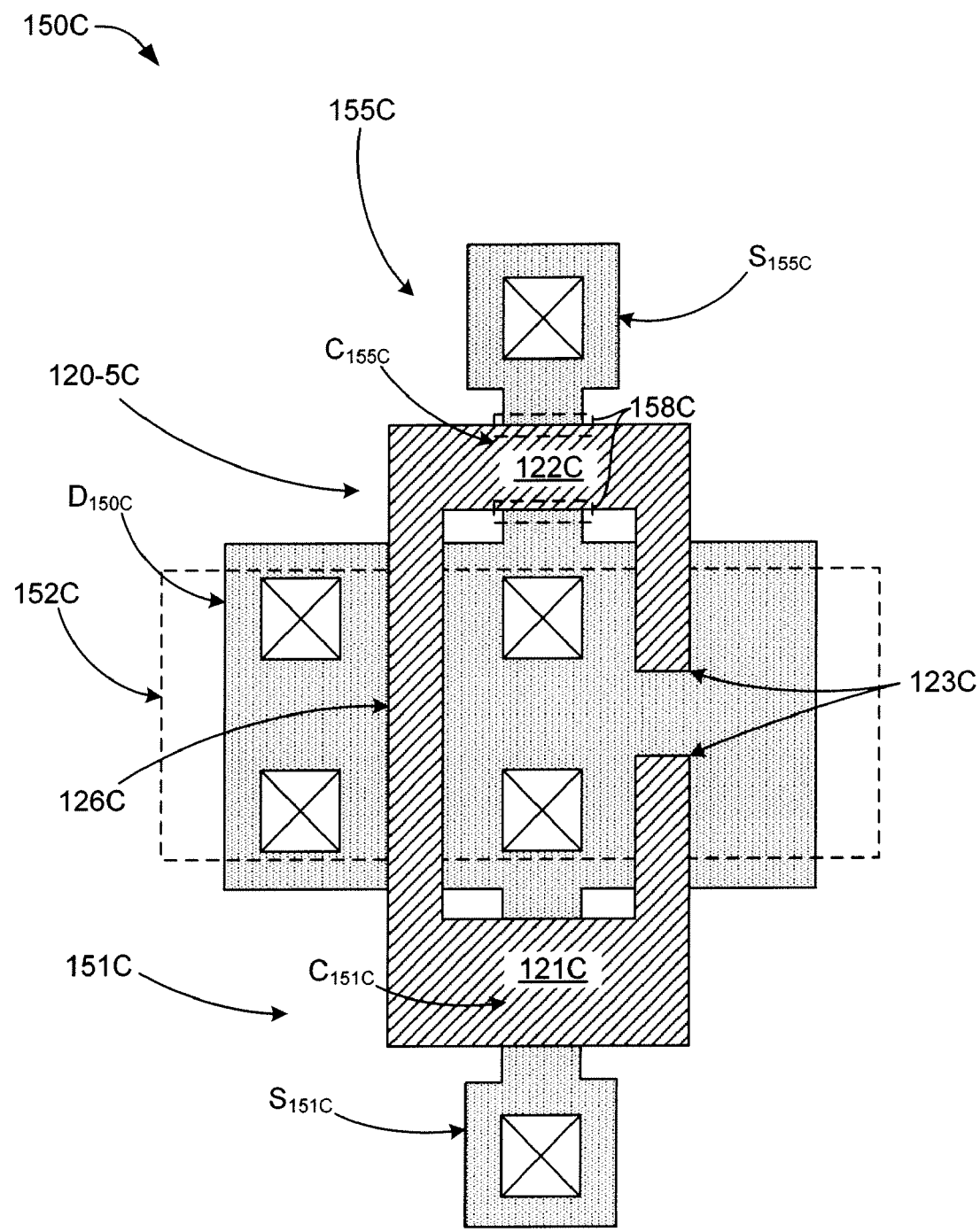
FIG. 15 is simplified top plan (layout) view showing a three terminal NMOS NVM cell according to yet another specific embodiment of the present invention.

FIG. 15 is a simplified top plan view showing a three-terminal (two-channel) NMOS NVM cell 150C according to another specific embodiment of the present invention. Similar to NVM cell 150B (discussed above), NVM cell 150C includes read NMOS transistor 151C having a source region $S_{151C}$, an injection transistor 155C having a source region $S_{155C}$, and an enlarged drain region $D_{150C}$ separated by a channel regions $C_{151C}$ and $C_{155C}$, and a "C" shaped polysilicon floating gate 120-5C formed on an HV oxide (not shown). However in this embodiment, read transistor source region $S_{152C}$ and injection transistor source region $S_{155C}$ are disposed on opposite sides of drain region $D_{150C}$ such that channel regions $C_{151C}$ and $C_{155C}$ are separated by drain region $D_{150C}$, and such that an intervening (sixth) portion 126C of floating gate 120-5C extends over a portion of drain region $D_{150C}$ between first portion 121C and second portion 122C. NVM cell 150C is subjected to the LDD implant processes in the manner described above to facilitate the formation of drain implant 152C and optional CHE enhancing implant regions 158C similar to those described above with reference to FIGS. 8-13.

NVM cells 150B and 150C (shown in FIGS. 14 and 15) are used, for example, when there is no confidence in implant merging under the coupling extension polysilicon. This may be the case in special processes used, e.g., for fabrication of Power Management IC. Corresponding products are often "5 V only" to save the masks intended for 1.8 v logics in the core CMOS process flow. In this case, only ~100 A-140 A GOX is used (both in the NVM area and in the logic part of the microcircuit).

Figure 16:
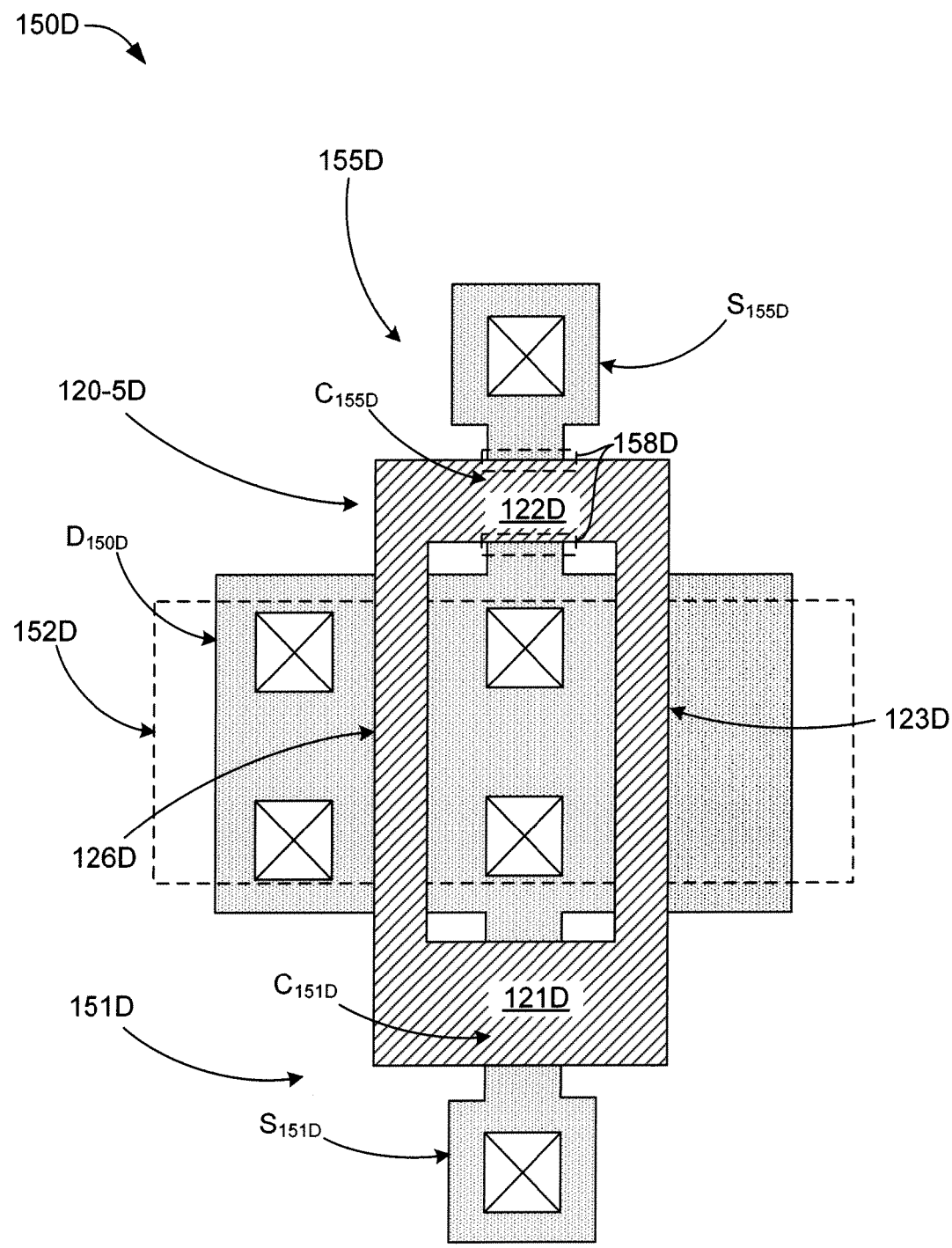
FIG. 16 is simplified top plan (layout) view showing a three-terminal NMOS NVM cell according to yet another specific embodiment of the present invention.

FIG. 16 is simplified top plan view showing a three-terminal (two-channel) NMOS NVM cell 150D according to yet another specific embodiment of the present invention. NVM cell 150D is similar to NVM cell 150C (discussed above) in that NVM cell 150D includes a read NMOS transistor 151D having a source region $S_{151D}$, and an injection transistor 155D having a source $S_{155D}$ that are disposed on opposite sides of an enlarged drain region $D_{150D}$, and a floating gate 120-5D that includes first and second portions 121D and 122D that are connected by an extension portion 126D. However, NVM cell 150D differs from NVM cell 150C in that (third) portion 123 extends entirely across drain region $D_{150D}$, such that a substantially "O" (ring-like or circular) shape is formed by polysilicon gate structure 120-5D. The ring-like structure of polysilicon gate 120-5D make NVM cell 150D the most compact implementation of read-disturb-free NVM cell based on the proposed principle. NVM cell 150D is subjected to the LDD implant processes in the manner described above to facilitate the formation of drain implant 152D and optional CHE enhancing implant regions 158D similar to those described above with reference to FIGS. 8-13.

Figure 17A:
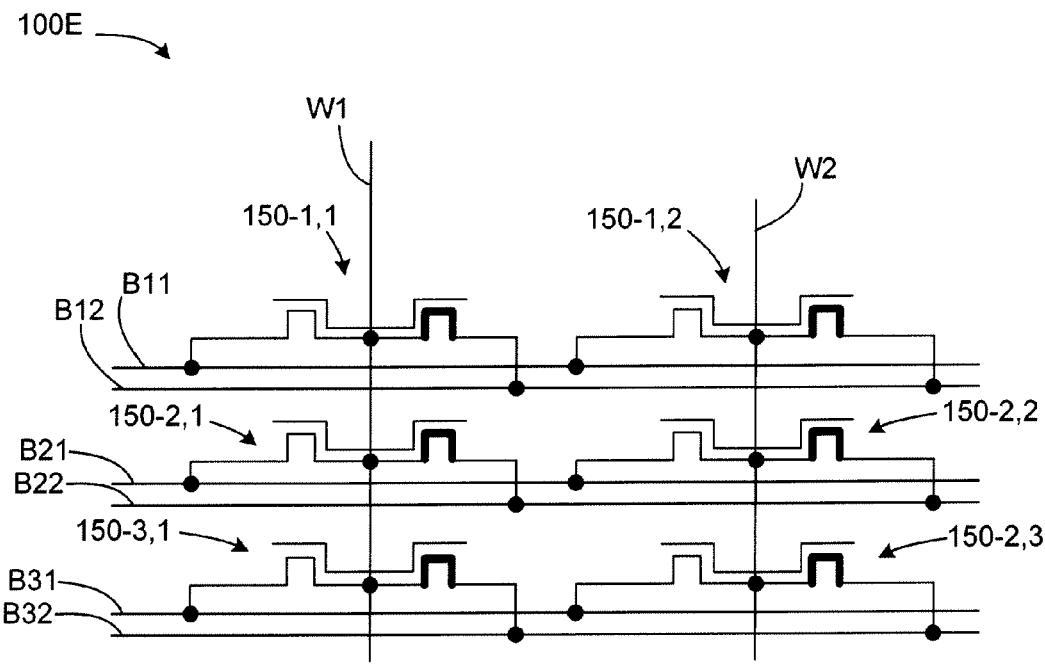
FIGS. 17(A) and 17(B) are simplified circuit diagrams showing arrays of three-terminal NMOS NVM cells connected to an addressing scheme according to a specific embodiment of the present invention.
Figure 17B:
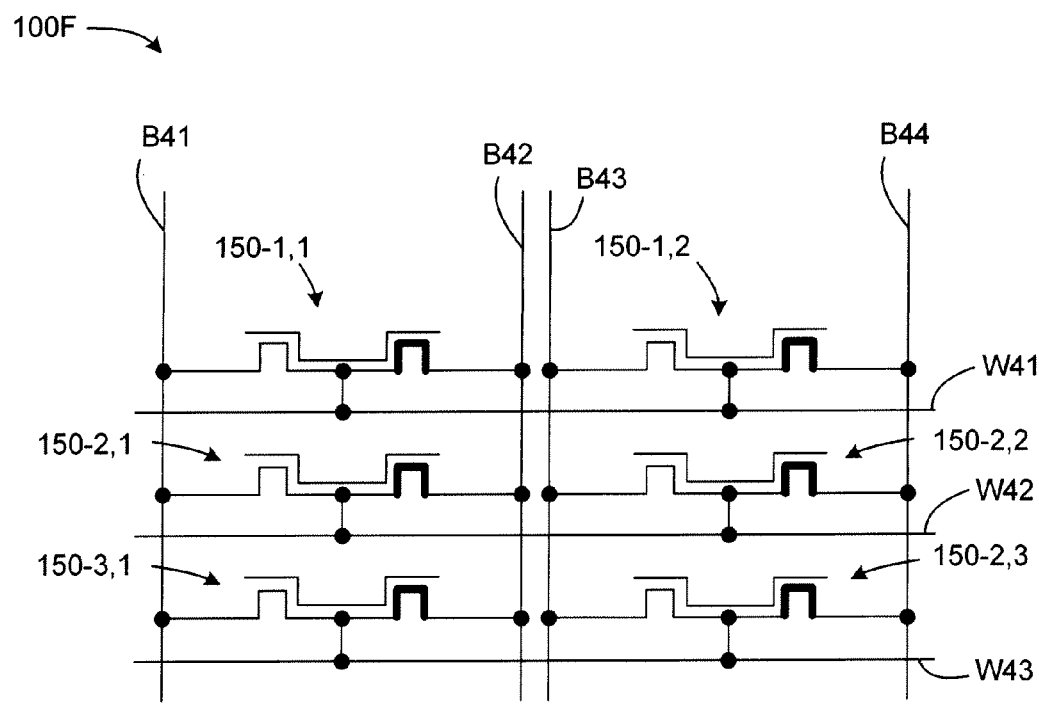

FIGS. 17(A) and 17(B) are simplified circuit diagrams showing various arrays of three-terminal NMOS NVM cells, which are constructed in the manner described above with reference to the specific embodiments of FIGS. 3-16, as arranged and connected to associated addressing schemes. These addressing schemes facilitate cell operations while minimizing occupied chip space, and are optimized in the manner described below to facilitate programming and erasing operations.

FIG. 17(A) is a simplified circuit diagram showing a portion of a CMOS IC 100E including three-terminal NMOS NVM cells 150-x,y arranged in an array including three rows and two columns, where "x,y" represents the row number and column number, respectively. The array includes word lines W1 and W2 and bit lines B11, B12, B21, B22, B31 and B32 that are connected to associated NVM cells 150-x,y, and are also connected to addressing/control circuitry (e.g., circuits 160 and 170; see FIG. 1) in order to perform program/erase and read operations on the NVM cells. NVM cells 150-x,y are implemented using any of the specific three-terminal NVM cells described herein. Word lines W1 and W2 are disposed parallel to the columns of three-terminal NVM cells, and each word line is connected to the drain region of each NVM cell of an associated column. For example, word line W1 is connected to drain region of NVM cell 150-1,1, and also to the drain regions of NVM cell 150-2,1 and 150-3,1. Conversely, bit lines B11 to B32 are disposed parallel to the rows of NVM cells, and each bit line is connected to a read source region or injection source region of each NVM cell of an associated row. For example, bit line B11 is connected to the read source regions of NVM cells 150-1,1 and 150-1,2, and bit line B12 is connected to the injection source regions of NVM cells 150-1,1 and 150-1,2. With this arrangement, the program/erase/read circuitry (not shown) addresses a selected NVM cell (e.g., NVM cell 150-1,1) during program/erase operations by selectively applying predetermined programming voltages to the word line (e.g., W1) and the bit line (e.g., B12) that is associated with the selected NVM cell, and during read operations by applying a predetermined read voltage to the word line (e.g., W1), by applying 0 voltage to the source (e.g., B11) that is associated with the selected NVM cell, and measuring the drain-source current. Note that the remaining word lines and bit lines are disconnected (floating) during the program/erase and read operations directed to the selected NVM cell.

FIG. 17(B) is a simplified circuit diagram showing a portion of a CMOS IC 100F according to an alternative embodiment, where word lines W41, W42 and W43 are disposed parallel to the rows of three-terminal NVM cells, and each word line is connected to the drain region of each NVM cell of an associated row. For example, word line W41 is connected to drain region of NVM cell 150-1,1, and also to the drain region of NVM cell 150-1,2. Bit lines B41 to B44 are disposed parallel to the columns of NVM cells, and each bit line is connected to a read source region or injection source region of each NVM cell of an associated column.

Figure 18:
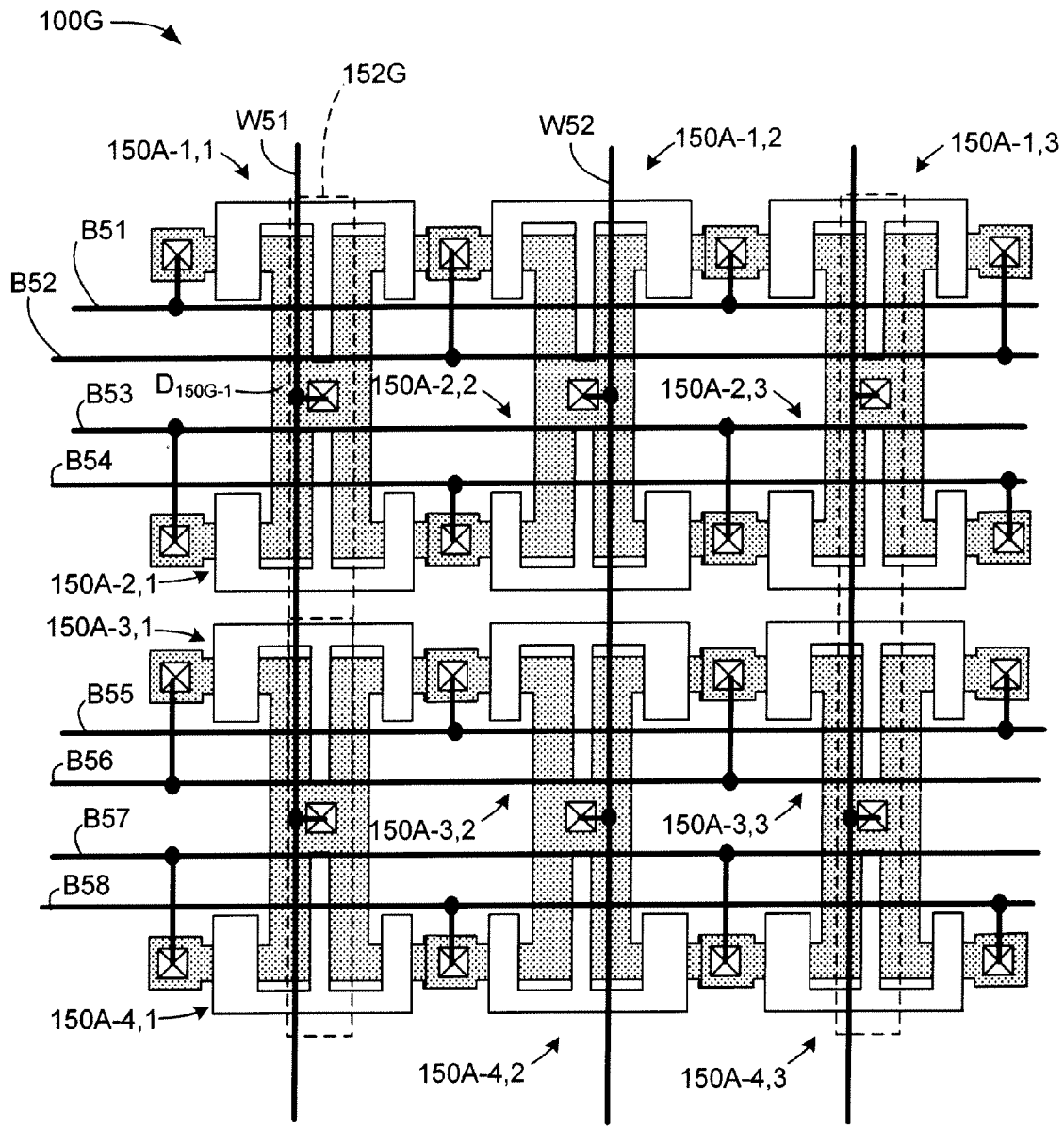
FIG. 18 is simplified partial plan view showing arrays of three-terminal NMOS NVM cells connected to addressing schemes according to another specific embodiment of the present invention.

FIG. 18 is a partial simplified plan view showing an IC circuits 100G including NVM cells 150A-1,1 to 150A-4,2 arranged in four rows and two columns. NVM cell 150A-1,1 is consistent with NVM cell 150A, described above with reference to FIGS. 4 and 5. Consistent with the arrangement described above with reference to FIG. 17(A), each column of NVM cells is coupled to a common word line (e.g., NVM cells 150A-1,1, 150A-2,1, 150A-3,1 and 150A-4,1 are connected to word line W51, and NVM cells 150A-1,2, 150A-2,2, 150A-3,2 and 150A-4,2 are connected to word line W52), and each NVM cells in each row of the array of CMOS circuit 100G share two adjacent bit lines (e.g., the read transistor source regions of cells 150A-1,3 and 150A-1,2 are connected to bit line B51, and the injection transistor source regions of cells 150A-1,1 and 150A-1,2 are connected to bit line B52). Bit lines B53 and B54 are similarly connected to the sources of the second row, bit lines B55 and B56 are similarly connected to the sources of the third row, and bit lines B57 and B58 are similarly connected to the sources of the fourth row. To minimize space, according to the embodiment shown in FIG. 18, drain regions of each adjacent pair of NVM cells in each column are combined (connected together) and connected to the associated word line by a common connection point. For example, cells 150A-1,1 and 150A-2,1 are inverted and share a common drain $D_{150G-1}$ that is connected to word line W51. For similar reasons, at least two cells in each column share a common drain diffusion that is formed in accordance with the description provided above. For example, NVM cells 150A-1,1 and 150A-2,1 share elongated drain diffusion 152G, which also extends under cells 150A-3,1 and 150A-4,1.

Figure 19:
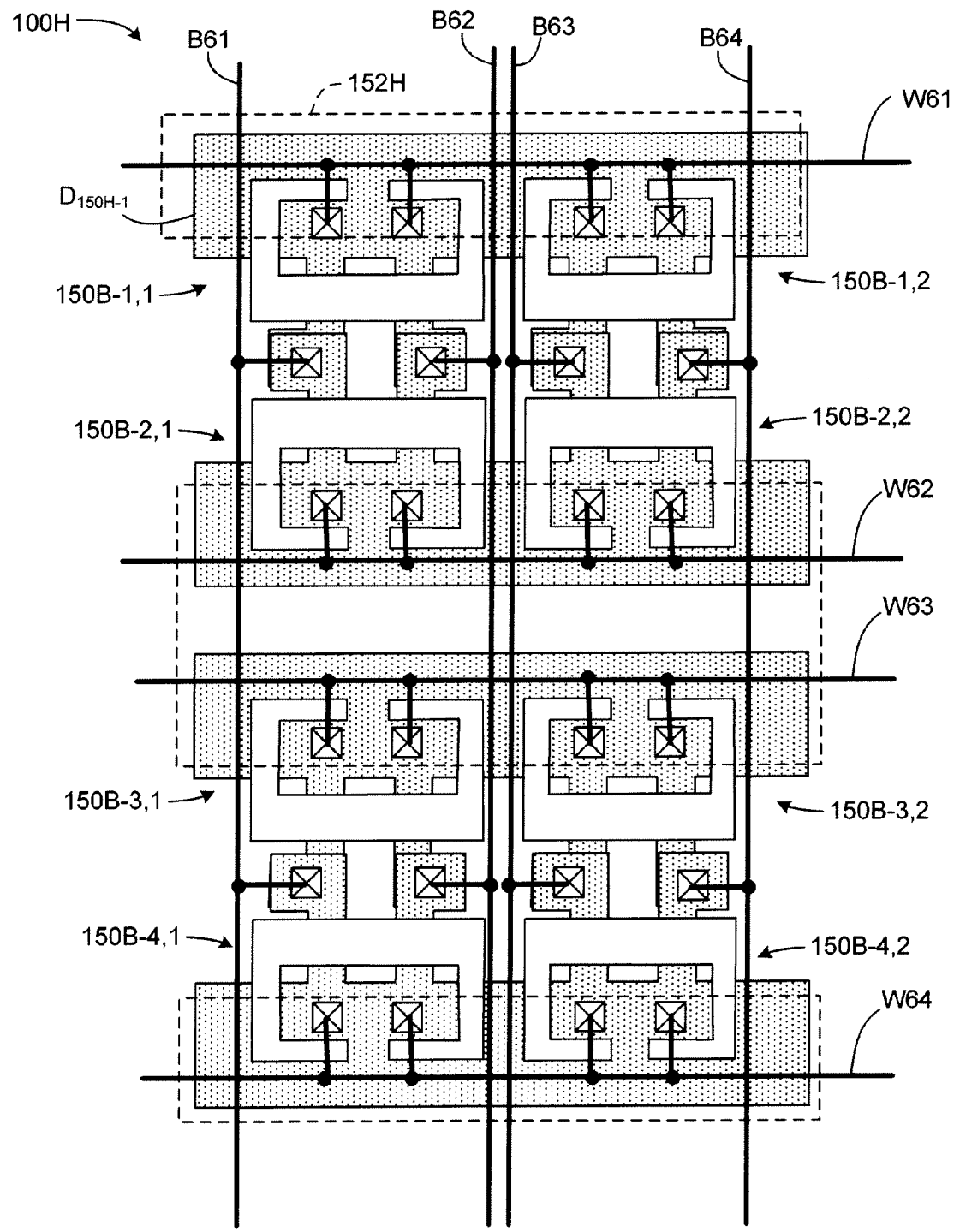
FIG. 19 is a simplified partial plan view showing an array of three-terminal (two-channel) NMOS NVM cells connected to an addressing scheme according to another specific embodiment of the present invention.

FIG. 19 shows a portion of a CMOS IC 100H including an array of NVM cells arranged according to another embodiment, wherein each NVM cell is consistent with the NVM cell 150B described above with reference to FIG. 14, and the drain regions of NVM cells in each row are connected together and to a shared word line, and source regions of NVM cells in each column are connected to shared bit lines in the manner described above with reference to FIG. 17(B). For example, the drain regions of NVM cells 150B-1,1 and 150B-1,2 are connected to word line W61, where the source regions of NVM cell 150B-1,1 are respectively connected to bit lines B61 and B62 and the source regions of NVM cell 150B-1,2 is connected to bit lines B63 and B64. In contrast to the arrangement described above with reference to FIG. 18, all cells in each row share drain implant regions. For example, drain $D_{150H-1}$ and a drain implant 152H are shared by adjacent row cells 150B-1,2 and 150B-2,2. Similar diffusions are shared by cells 150B-2,1, 150B-2,2, 150C-3,1, 150C-3,2, 150C-4,1 and 150C-4,2 of the remaining rows.

Figure 20:
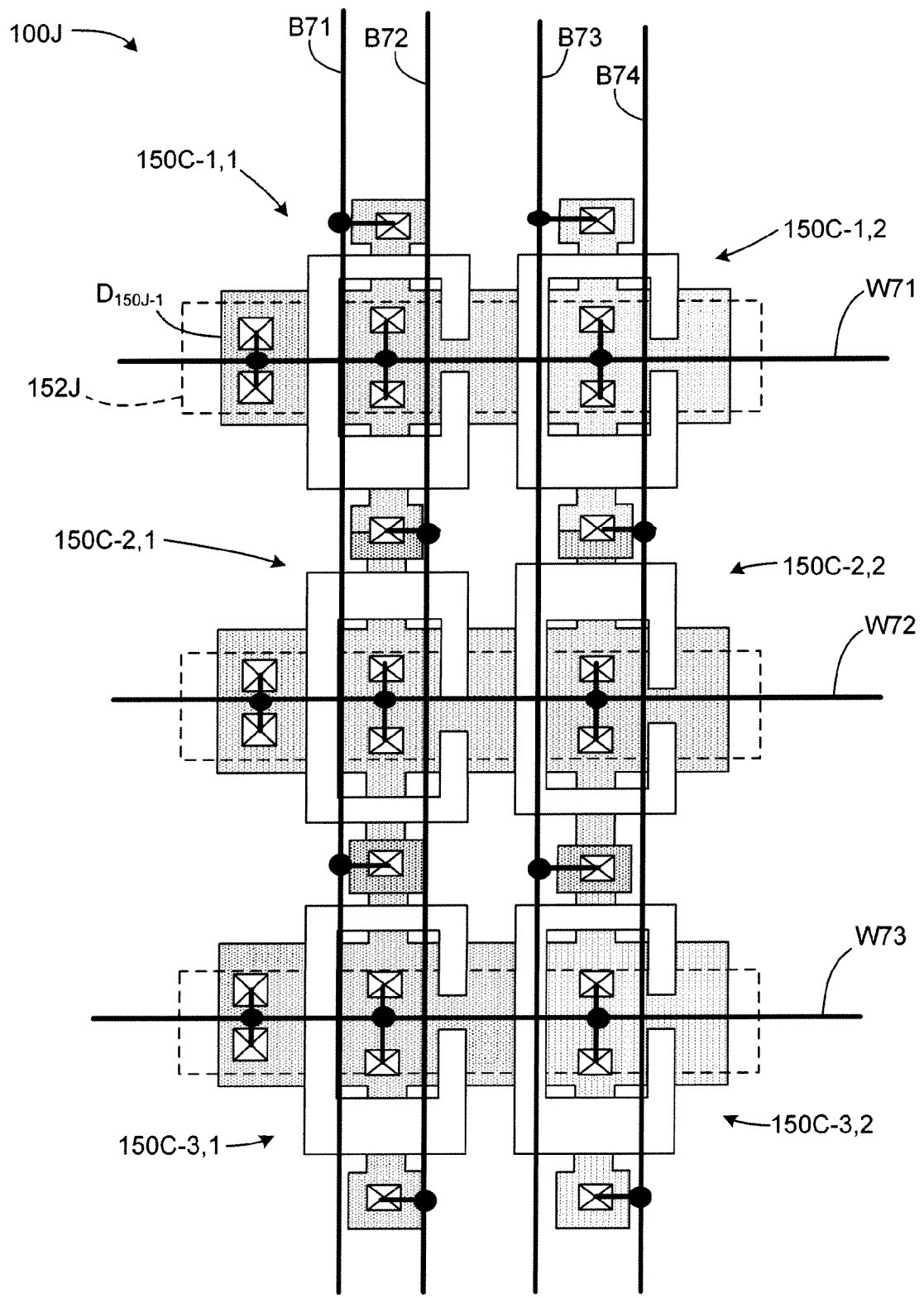
FIG. 20 is a simplified partial plan view showing an array of three-terminal NMOS NVM cells connected to an addressing scheme according to another specific embodiment of the present invention.

FIG. 20 shows a portion of a CMOS IC 100J including an array of NVM cells arranged according to another embodiment, wherein each NVM cell is consistent with the NVM cell 150C described above with reference to FIG. 15, and the drain regions of NVM cells in each row are connected together and to a shared word line, and source regions of NVM cells in each column are connected to shared bit lines in the manner described above with reference to FIG. 17(B). For example, the drain regions of NVM cells 150C-1,1 and 150C-1,2 are connected to word line W71, where the source regions of NVM cell 150C-1,1 are respectively connected to bit lines B71 and B72 and the source regions of NVM cell 150C-1,2 is connected to bit lines B73 and B74. All cells in each row share a common drain and a drain implant region. For example, adjacent row cells 150C-1,1 and 150C-1,2 share a common drain $D_{150J-1}$, and a shared drain implant 152J. Similar diffusions are shared by cells 150C-2,1 and 150C-2,2 of the second row, and cells 150C-3,1 and 150C-3,2 of the third row.

Figure 21:
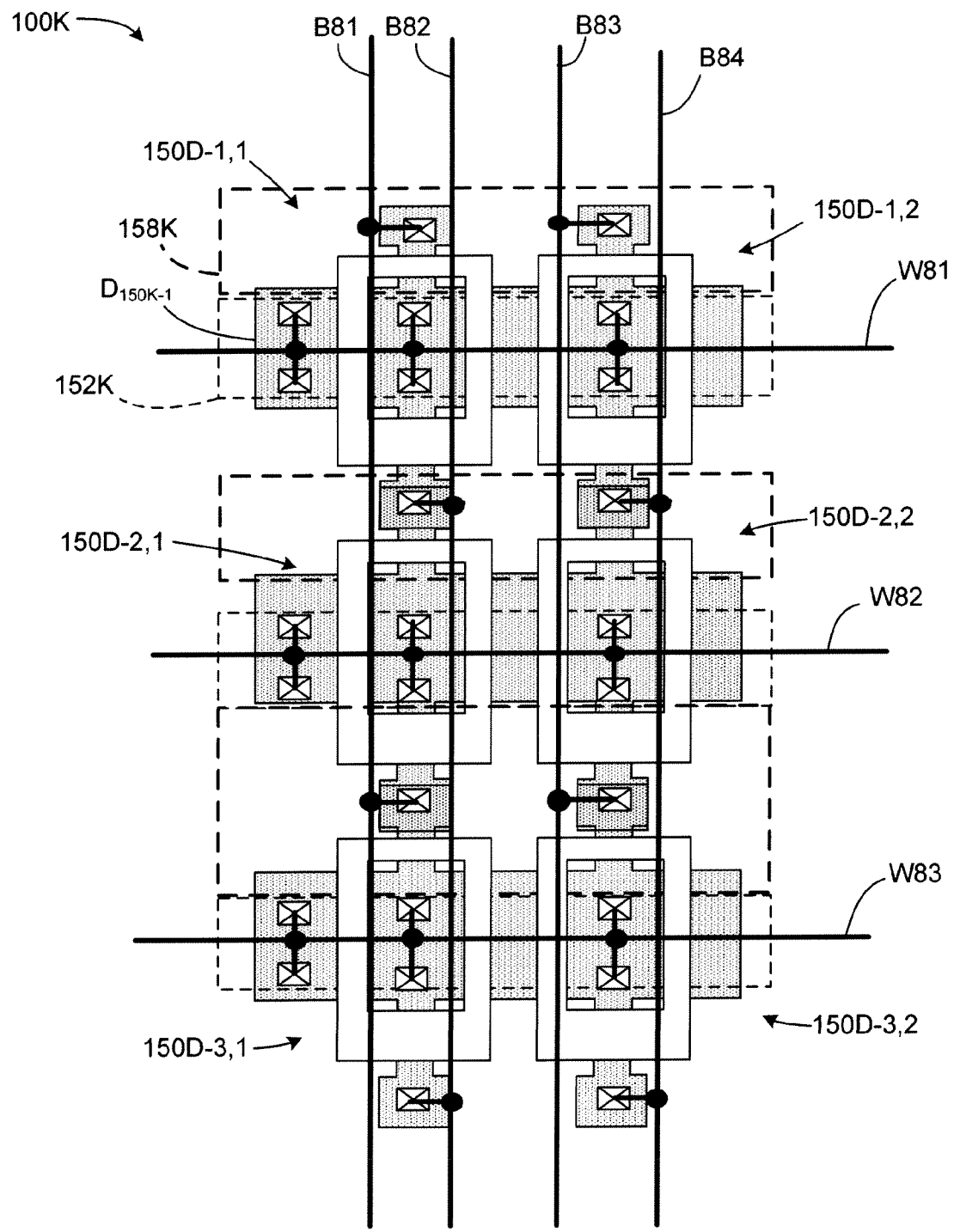
FIG. 21 is a simplified partial plan view showing an array of three-terminal NMOS NVM cells connected to an addressing scheme according to another specific embodiment of the present invention.

In yet another embodiment shown in FIG. 21, a CMOS IC 100K includes an array of NVM cells wherein each NVM cell is consistent with the NVM cell 150D described above with reference to FIG. 16, and the drain regions of NVM cells in each row are connected together and to a shared word line, and source regions of NVM cells in each column are connected to shared bit lines in the manner described above with reference to FIG. 17(B). For example, the drain regions of NVM cells 150D-1,1 and 150D-1,2 are connected to word line W81, where the source regions of NVM cell 150D-1,1 are respectively connected to bit lines B81 and B82 and the source regions of NVM cell 150D-1,2 is connected to bit lines B83 and B84. All cells in each row share a common pocket implant region, a drain and a drain implant region. For example, adjacent row cells 150D-1,1 and 150D-1,2 share a common drain $D_{150K-1}$ and a shared drain implant 152K. Similar diffusions are shared by cells 150D-2,1 and 150D-2,2 of the second row, and cells 150D-3,1 and 150D-3,2 of the third row.

Figure 22:
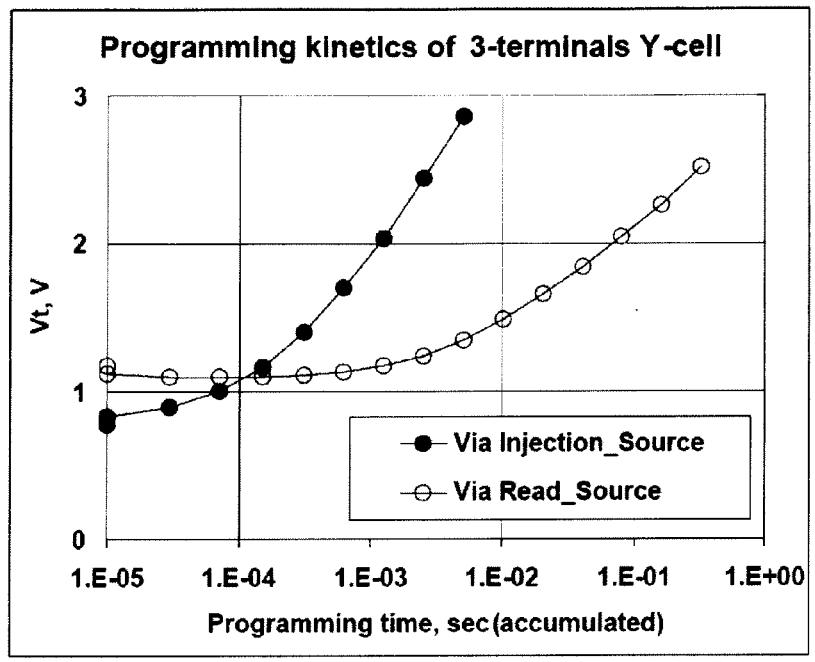
FIG. 22 is a graph including cell programming data generated for three-terminal NMOS NVM cells showing the benefit of using an injection transistor.
Figure 23:
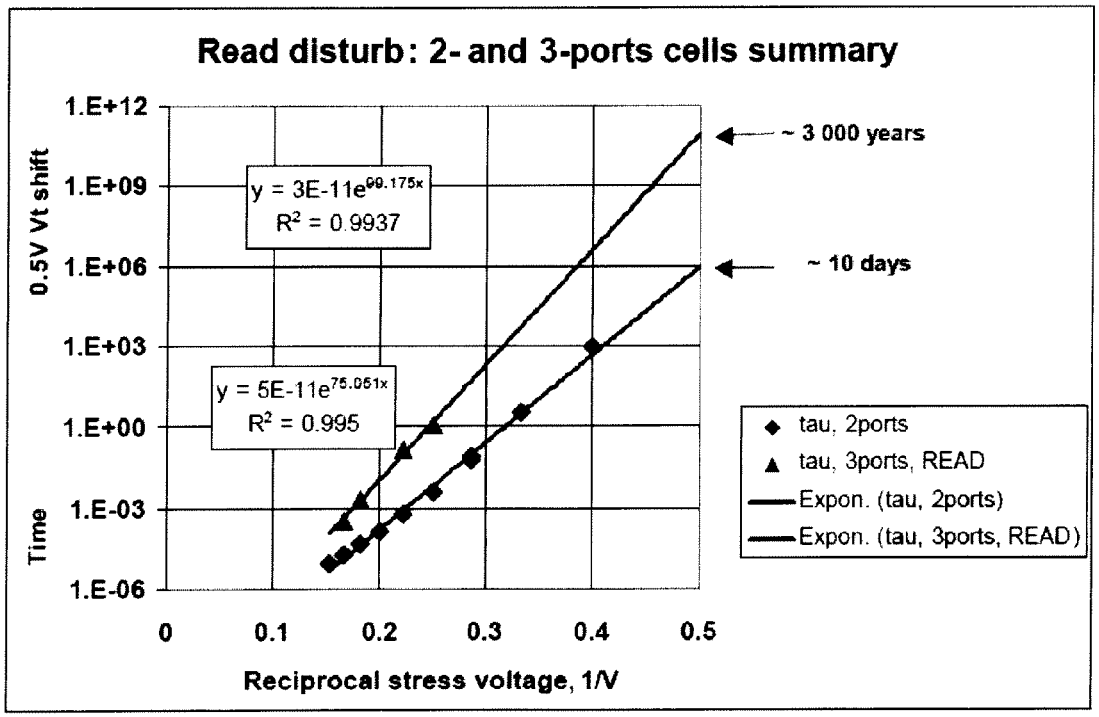
FIG. 23 is a graph showing read disturb data generated for three-terminal NMOS NVM cells of the present invention.

FIGS. 22 and 23 include graphs showing experimentally generated data on prototype two-channel NVM cells (on silicon) at the single cell level.

FIG. 22 is a graph showing cell programming test data generated for three-terminal NMOS NVM cells, and indicates that when programming is performed by way of the injection transistor of the cells, programming time is reduced and accumulated charge is increased in comparison to programming by way of the read transistor. It is seen that with 4.5V at drain, only several milliseconds are necessary to obtain a ~2V memory window by programming through the W=0.35 um (min DR) injection transistor. Several seconds are needed to program the NVM cell to the same level through the reading transistor with the same Poly CD.

FIG. 23 is a graph showing "Time-to-failure" Takeda plot (lifetime vs. reciprocal drain voltage) data for Two-Terminal (single channel) and Three-Terminal (two-channel) cells. The failure is defined as a ~400 mV FG potential increase. The graph demonstrates the extrapolated time necessary for the 400 mV FG potential increase at different drain voltages in the read-out operation. For two-terminal cells, a 10 day continuous read at a typical 2V voltage results in failure. In the proposed Three-Terminal NVM cell the read disturb is not an issue (3000 years of continuous operation till the read disturb results in failure).

Although the present invention has been described with respect to certain specific embodiments, it will be clear to those skilled in the art that the inventive features of the present invention are applicable to other embodiments as well, all of which are intended to fall within the scope of the present invention. For example, in alternative embodiments a number of different programming and erasing methods may be used, e.g., erasing with ultraviolet (UV) light, programming using an avalanche breakdown in the drain region, etc. In addition, a pocket implant or another special drain engineering scheme may be performed in the transistor source/drain regions to enhance lateral electrical fields and thus increase the efficiency of programming and erase. An additional Poly topology over the drain connected Active area may be used to increase coupling to the floating gate.

Moreover, although the present invention is described with reference to NMOS NVM cells, those skilled in the art will recognize that the concepts described above may be utilized to produce NVM cells having similar characteristics but employing PMOS transistors placed in N-wells, e.g., a PMOS NVM injection transistor programmed using hot hole induced electron injection, NMOS readout transistor and array organization without select transistors. An NVM cell 150L utilizing a PMOS transistor for programming and an NMOS transistor for readout and erase is shown in FIGS. 24 and 25, and a corresponding array incorporating NVM cell 150L is shown in FIG. 26.

Figure 24:
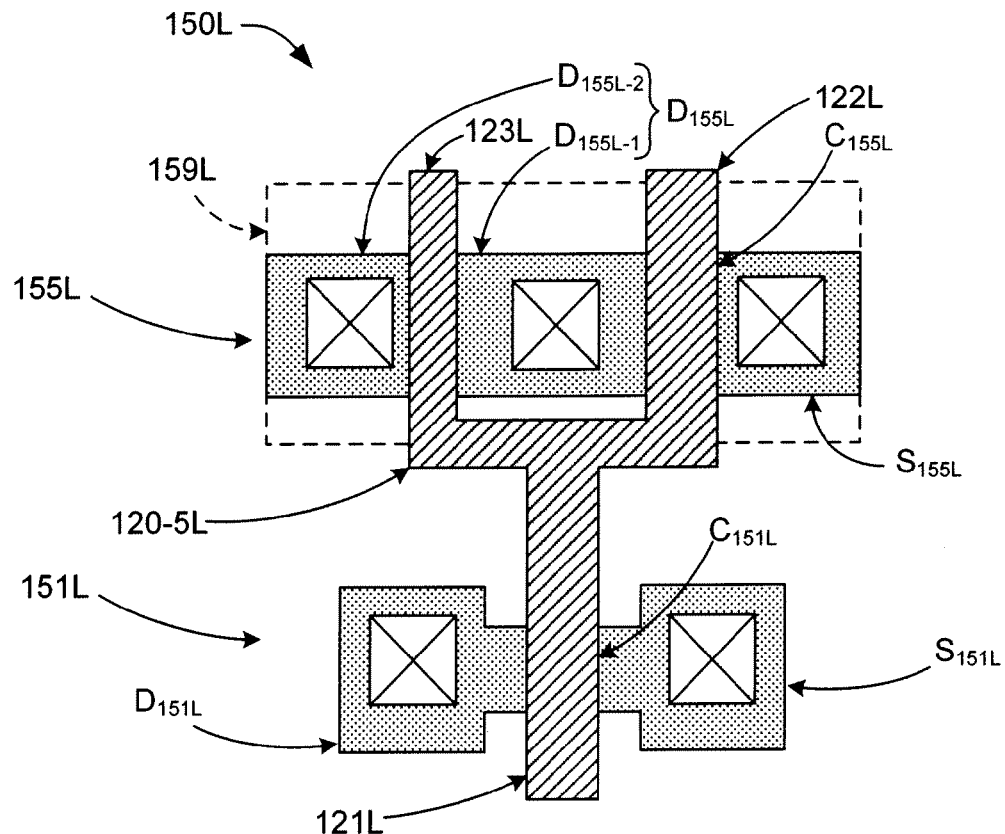
FIG. 24 is a simplified partial plan view showing an NVM cell according to another specific embodiment of the present invention.
Figure 25:
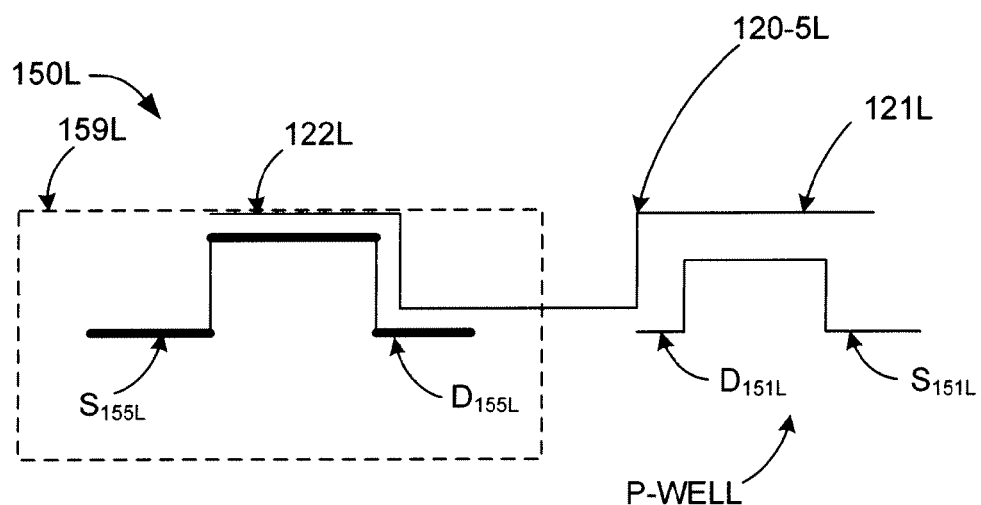
FIG. 25 is a simplified circuit diagram showing the NVM cell of FIG. 24 in additional detail.
Figure 26:
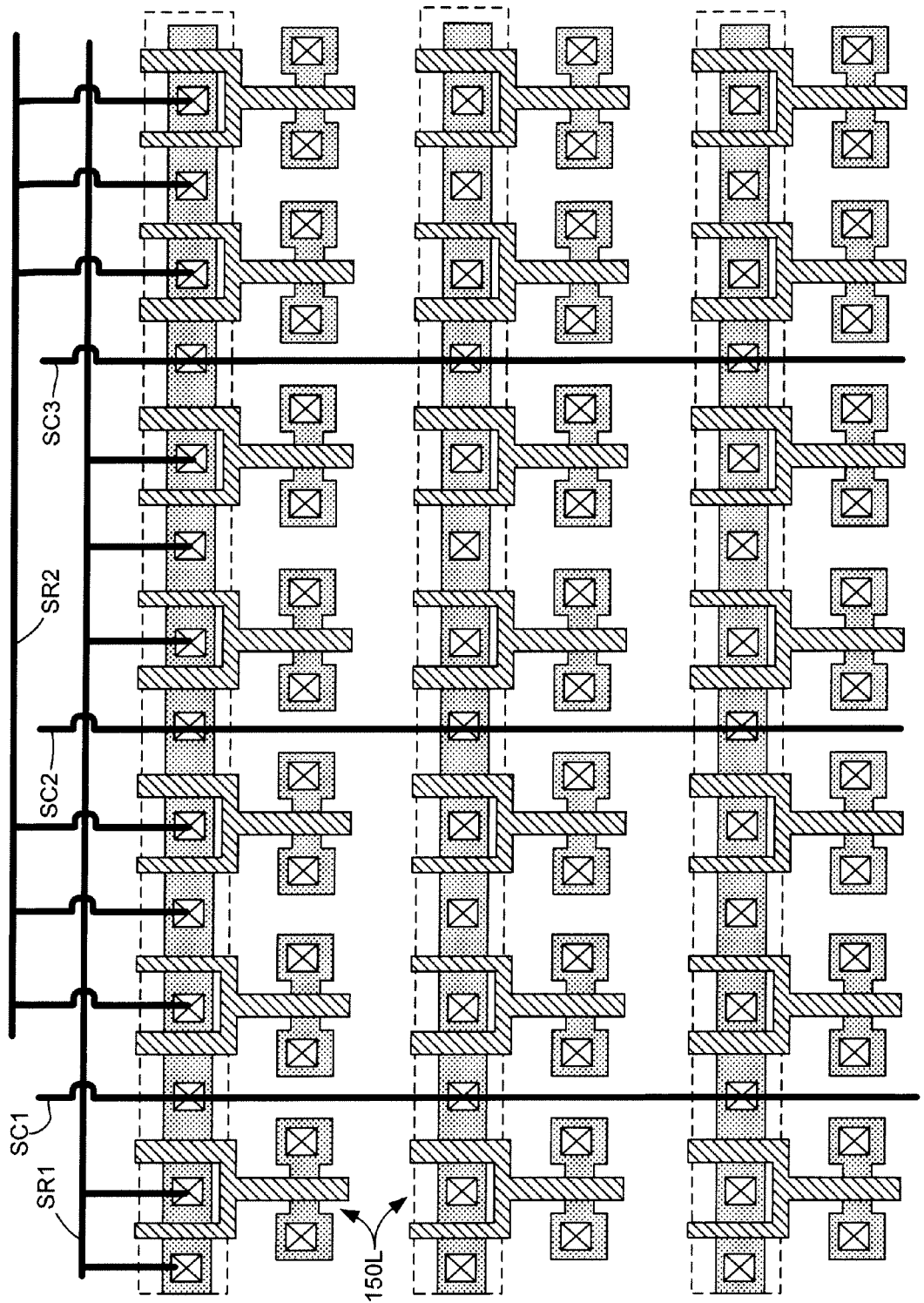
FIG. 26 is a simplified partial plan view showing an array including the NVM cells of FIG. 24 connected to an addressing scheme according to another specific embodiment of the present invention.

Referring to FIGS. 24 and 25, memory cell 150L consists of injection channel PMOS transistor 155L and a readout/erase NMOS transistor 151L that share a "Y" shaped floating gate 120-5L. Readout NMOS transistor 151L includes a source region $S_{151L}$ and a drain region n that are separated by a first portion 121L of floating gate 120-5L. Injection transistor 155L is formed in an N-Well 159L and includes a source region $S_{155L}$ and a drain region $D_{155L}$ that are separated by a second portion 122L, where drain region $D_{155L}$ includes two sections $D_{155L-1}$ and $D_{155L-2}$ that are bisected by a narrow third portion 123L of gate 120-5L, which acts as an extension for increasing the drain coupling. A channel $C_{155L}$ of injection transistor 155L is implanted with LV PLDD implant. The area of extension (i.e., the region including sections $D_{155L-1}$ and $D_{155L-2}$) is implanted with both HV PLDD and LV PLDD to stimulate implant merging under the undersized Poly of the extension with the width of 0.14 um-0.2 um in 0.18 um Design Rules. Channel region $C_{151L}$ of readout transistor 151L is implanted with LV NLDD implant (to enhance BBT of holes for erase).

Programming of cell 150L is performed by channel hot holes induced electron injection (CHHEI). For this purpose, voltage of 5-6V is applied to N-well 158L, and drain region $D_{155L}$ of injection transistor 155L is connected to ground. Source region $S_{155L}$ is at the same potential as that of N-Well 158L, and the source and drain of readout transistor 151L are coupled to ground. Due to capacitive coupling, a voltage of -1V to -2V with respect to N-Well 159L is transferred to floating gate 120-5L. Injection transistor 155L is thus slightly open (Vt of PMOS is of the order of -0.8V), and there is a flow of holes in channel $C_{155L}$. The holes create electron-hole pairs in drain region $D_{155L}$ and secondary electrons are injected into floating gate 120-5L (the vertical field in the drain region facilitates injection). To erase the cell, zero voltage is applied to N-well 158L, while negative voltage (from 0 to -6V) is applied to P+ diffusions of the injection transistor (i.e., drain region $D_{155L}$ and source region $S_{155L}$) and positive voltage is applied to drain D151L of the read-out/erase NMOS transistor 151L. Due to strong capacitive coupling, negative potential is transferred to floating gate 120-5L. This enhances the BBT of holes and their injection into floating gate 120-5L in drain region $D_{151L}$ of readout transistor 151L. The advantage of the described embodiment is low program currents. This is similar to CHISEL case described for other embodiments, but the currents are lower (in the range 1 to 10 uA/cell for the same programming times). Vertical field assists electron injection thus enhancing its efficiency.

In the read-out operation all terminals of injection transistor 151L are maintained at 2-2.5 V, while drain region $D_{151L}$ of read-out transistor 151L is maintained at ~1V (source $S_{151L}$ is coupled to ground). This ensures absence of the read disturb (low drain voltages in read and longer channel $C_{151L}$, e.g. L=0.5-1 um, thus no channel hot electron effects are pronounced though drain field is enhanced to ensure efficient erase (in addition to low Vd in read)). The price for lower programming currents and absence of read disturb is up to 25% increase of the cell area compared with previous embodiments (due to "N-Well to S/D P+ spacing" DR). The embodiment allows similar to the previous cases cross-point array organization (shown in FIG. 26). The drains of the memory cells are connected in two groups. A memory cell 150L for programming is selected by choosing an "Injection Source" column line SC1, SC2 or SC3 and an "Injection drain" row line SR1 or SR2. The same principle is used in the read-out and erase. The adjacent sources are bound and connected to ground during read and left floating during erase. Drains are selected out of the two groups.

In all discussed embodiments except those associated with FIGS. 24-26, the source terminal of the read transistor can be connected to the drain of injection transistor during programming. This increases the drain capacitive coupling ratio and results in twice faster programming and up to 0.7V increase of the programming window.

The invention claimed is:

1. A complimentary metal-oxide-silicon (CMOS) integrated circuit (IC) comprising:
    a substrate; and
    a multi-terminal non-volatile memory (NVM) cell including:
    a first source region and a second source region, each including a first dopant diffused into the substrate such that the first source region is electrically isolated from the second source region;
    a drain region including a second dopant diffused into the substrate and disposed such that the drain region is separated from the first source region by a first channel region and separated from the second source region by a second channel region; and
    a polycrystalline silicon (polysilicon) floating gate including a first portion that is at least partially disposed over the first channel region, a second portion that is at least partially disposed over the second channel region, and a third portion that is at least partially disposed over the drain region;
    wherein the polycrystalline silicon floating gate, the first and second source regions and the drain region are formed such that a gate-drain capacitance between said polycrystalline silicon floating gate and said drain region is substantially higher than both a first gate-source capacitance between said polycrystalline silicon floating gate and said first source region, and a second gate-source capacitance between said polycrystalline silicon floating gate and said second source region, and
    wherein a first diffusion region extending from said drain region into the second channel region has a first doping concentration and a second diffusion region extending from said second source region into the second channel region includes a second doping concentration, the second doping concentration being different from the first doping concentration,
    wherein the first doping concentration of the first diffusion region is less than the second doping concentration of the second diffusion region.

2. The CMOS IC of claim 1, wherein the first doping concentration of the first diffusion region is greater than the second doping concentration of the second diffusion region.

3. A complimentary metal-oxide-silicon (CMOS) integrated circuit (IC) comprising:
    a substrate; and
    a multi-terminal non-volatile memory (NVM) cell including:
    a first source region and a second source region, each including a first dopant diffused into the substrate such that the first source region is electrically isolated from the second source region;

a drain region including a second dopant diffused into the substrate and disposed such that the drain region is separated from the first source region by a first channel region and separated from the second source region by a second channel region; and a polycrystalline silicon (polysilicon) floating gate including a first portion that is at least partially disposed over the first channel region, a second portion that is at least partially disposed over the second channel region, and a third portion that is at least partially disposed over the drain region;

wherein the polycrystalline silicon floating gate, the first and second source regions and the drain region are formed such that a gate-drain capacitance between said polycrystalline silicon floating gate and said drain region is substantially higher than both a first gate-source capacitance between said polycrystalline silicon floating gate and said first source region, and a second gate-source capacitance between said polycrystalline silicon floating gate and said second source region, and wherein a first diffusion region extending from said drain region into the second channel region has a first doping concentration and a second diffusion region extending from said second source region into the second channel region includes a second doping concentration, the second doping concentration being different from the first doping concentration, wherein the polycrystalline silicon floating gate comprises:
an elongated first portion disposed over the first channel region such that the first portion is disposed adjacent to a first section of the drain region,
an elongated second portion disposed over the second channel region such that the second portion is disposed adjacent to said first diffusion region, and
at least one elongated third portion extending over a third section of the drain region, the third section being spaced from the first section and the first diffusion region.

4. The CMOS IC of claim 3, wherein the first doping concentration of the first diffusion region is less than the second doping concentration of the second diffusion region.

5. The CMOS IC of claim 3, wherein the polycrystalline silicon floating gate further comprises a fourth portion connected between the elongated first portion and the elongated third portion and a fifth portion connected between the elongated second portion and the elongated third portion such that the first, second, third, fourth and fifth portions comprise one of a substantially T-shaped polysilicon structure.

6. The CMOS IC of claim 3, wherein the polycrystalline silicon floating gate further comprises a sixth portion connected between the elongated first portion and the elongated second portion, and the at least one elongated third portion extends from at least one of said first and second portions such that the first, second, third, and sixth portions comprise one of a substantially C-shaped polysilicon structure, a substantially O-shaped polysilicon structure and a substantially U-shaped polysilicon structure.

7. The CMOS IC of claim 3, further comprising:
a low voltage (LV) MOSFET including a first polysilicon gate having predefined first width that is formed on a first gate oxide having a first oxide thickness, and first lightly doped drain (LDD) regions having said first doping concentration; and
a high voltage (HV) MOSFET including a second polysilicon gate having predefined second width that is formed on a second gate oxide, the second gate oxide having a second oxide thickness that is greater than the first oxide thickness, the HV MOSFET also including second LDD regions having said second doping concentration, wherein said polycrystalline silicon floating gate of said multi-terminal NVM cell is formed on a third gate oxide that has the second oxide thickness, and wherein said multi-terminal NVM cell further comprises an implanted region disposed below the third section of the polycrystalline silicon floating gate, said implanted region having a third doping concentration including a sum of said first doping concentration and said second doping concentration.

8. The CMOS IC of claim 7, wherein said implanted region extends entirely under said third section of said polycrystalline silicon floating gate such that said implanted region extends between opposing edges of said drain region located below opposing side edges of said third portion.

9. A complimentary metal-oxide-silicon (CMOS) integrated circuit (IC) comprising:
a substrate; and
a multi-terminal non-volatile memory (NVM) cell including:
a first source region and a second source region, each including a first dopant diffused into the substrate such that the first source region is electrically isolated from the second source region;
a drain region including a second dopant diffused into the substrate and disposed such that the drain region is separated from the first source region by a first channel region and separated from the second source region by a second channel region; and
a polycrystalline silicon (polysilicon) floating gate including a first portion that is at least partially disposed over the first channel region, a second portion that is at least partially disposed over the second channel region, and a third portion that is at least partially disposed over the drain region;

wherein the polycrystalline silicon floating gate, the first and second source regions and the drain region are formed such that a gate-drain capacitance between said polycrystalline silicon floating gate and said drain region is substantially higher than both a first gate-source capacitance between said polycrystalline silicon floating gate and said first source region, and a second gate-source capacitance between said polycrystalline silicon floating gate and said second source region, and wherein a first diffusion region extending from said drain region into the second channel region has a first doping concentration and a second diffusion region extending from said second source region into the second channel region includes a second doping concentration, the second doping concentration being different from the first doping concentration, the CMOS IC further comprising means for generating channel hot electrons (CHE) in the drain region, and means for generating band-to-band tunneling (BBT) holes in the second source region.

10. A complimentary metal-oxide-silicon (CMOS) integrated circuit (IC) comprising:
a substrate; and
a multi-terminal non-volatile memory (NVM) cell including:
a first source region and a second source region, each including a first dopant diffused into the substrate such that the first source region is electrically isolated from the second source region;
a drain region including a second dopant diffused into the substrate and disposed such that the drain region is separated from the first source region by a first channel region and separated from the second source region by a second channel region; and a polycrystalline silicon (polysilicon) floating gate including a first portion that is at least partially disposed over the first channel region, a second portion that is at least partially disposed over the second channel region, and a third portion that is at least partially disposed over the drain region;

wherein the polycrystalline silicon floating gate, the first and second source regions and the drain region are formed such that a gate-drain capacitance between said polycrystalline silicon floating gate and said drain region is substantially higher than both a first gate-source capacitance between said polycrystalline silicon floating gate and said first source region, and a second gate-source capacitance between said polycrystalline silicon floating gate and said second source region, and wherein said drain region and said second source region further includes an implant for enhancing channel hot electrons in the second channel region during a programming operation, the CMOS IC further comprising:

a low voltage (LV) MOSFET including a first polysilicon gate having predefined first width that is formed on a first gate oxide having a first oxide thickness, and first lightly doped drain (LDD) regions having a first doping concentration; and a high voltage (HV) MOSFET including a second polysilicon gate having predefined second width that is formed on a second gate oxide, the second gate oxide having a second oxide thickness that is greater than the first oxide thickness, the HV MOSFET also including second LDD regions having a second doping concentration, wherein both a first diffusion region extending from said drain region into the second channel region and a second diffusion region extending from said second source region into the second channel region include a sum of the second doping concentration and the implant.

11. The CMOS IC of claim 10, wherein said implant comprises a P-type implant.

12. The CMOS IC of claim 10, wherein the polycrystalline silicon floating gate comprises:

an elongated first portion disposed over the first channel region such that the first portion is disposed adjacent to a first section of the drain region, an elongated second portion disposed over the second channel region such that the second portion is disposed adjacent to said first section of the drain region, and at least one elongated third portion extending over a third section of the drain region, the third section being spaced from the first section and the second section.

13. The CMOS IC of claim 12, wherein the polycrystalline silicon floating gate further comprises a fourth portion connected between the elongated first portion and the elongated third portion and a fifth portion connected between the elongated second portion and the elongated third portion such that the first, second, third, fourth and fifth portions comprise one of a substantially T-shaped polysilicon structure.

14. The CMOS IC of claim 12, wherein the polycrystalline silicon floating gate further comprises a sixth portion connected between the elongated first portion and the elongated second portion, and at least one elongated third portion extends from at least one of said first and second portions such that the first, second, third, and sixth portions comprise one of a substantially C-shaped polysilicon structure, a substantially O-shaped polysilicon structure and a substantially U-shaped polysilicon structure.

15. The CMOS IC of claim 12, further comprising:

a low voltage (LV) MOSFET including a first polysilicon gate having predefined first width that is formed on a first gate oxide having a first oxide thickness, and first lightly doped drain (LDD) regions having a first doping concentration; and a high voltage (HV) MOSFET including a second polysilicon gate having predefined second width that is formed on a second gate oxide, the second gate oxide having a second oxide thickness that is greater than the first oxide thickness, the HV MOSFET also including second LDD regions having a second doping concentration, wherein said polycrystalline silicon floating gate of said multi-terminal NVM cell is formed on a third gate oxide that has the second oxide thickness, and wherein said multi-terminal NVM cell further comprises an implanted region disposed below the third section of the polycrystalline silicon floating gate, said implanted region having a third doping concentration including a sum of said first doping concentration and said second doping concentration.

16. The CMOS IC of claim 15, wherein said implanted region extends entirely under said third section of said polycrystalline silicon floating gate such that said implanted region extends between opposing edges of said drain region located below opposing side edges of said third portion.

17. The CMOS IC of claim 15, further comprising means for generating channel hot electrons (CHE) in the drain region, and means for generating band-to-band tunneling (BBT) holes in the second source region.

18. A complimentary metal-oxide-silicon (CMOS) integrated circuit (IC) comprising:

a substrate; and a multi-terminal non-volatile memory (NVM) cell including:

a first source region and a second source region, each including a first dopant diffused into the substrate such that the first source region is electrically isolated from the second source region;

a drain region including a second dopant diffused into the substrate and disposed such that the drain region is separated from the first source region by a first channel region and separated from the second source region by a second channel region; and a polycrystalline silicon (polysilicon) floating gate including a first portion that is at least partially disposed over the first channel region, a second portion that is at least partially disposed over the second channel region, and a third portion that is at least partially disposed over the drain region;

wherein the polycrystalline silicon floating gate, the first and second source regions and the drain region are formed such that a gate-drain capacitance between said polycrystalline silicon floating gate and said drain region is substantially higher than both a first gate-source capacitance between said polycrystalline silicon floating gate and said first source region, and a second gate-source capacitance between said polycrystalline silicon floating gate and said second source region, and wherein said drain region and said second source region further includes an implant for enhancing channel hot electrons in the second channel region during a programming operation, the CMOS IC further comprising:

a low voltage (LV) MOSFET including a first polysilicon gate having predefined first width that is formed on a first gate oxide having a first oxide thickness, and first lightly doped drain (LDD) regions having a first doping concentration; and a high voltage (HV) MOSFET including a second polysilicon gate having predefined second width that is formed on a second gate oxide, the second gate oxide having a second oxide thickness that is greater than the first oxide thickness, the HV MOSFET also including second LDD regions having a second doping concentration, wherein both a first diffusion region extending from said drain region into the second channel region and a second diffusion region extending from said second source region into the second channel region include a sum of a third doping concentration and the implant, the third doping concentration being different from the first doping concentration and the second doping concentration.

19. The CMOS IC of claim 18, wherein the polycrystalline silicon floating gate comprises:

an elongated first portion disposed over the first channel region such that the first portion is disposed adjacent to a first section of the drain region, an elongated second portion disposed over the second channel region such that the second portion is disposed adjacent to said first section of the drain region, and at least one elongated third portion extending over a third section of the drain region, the third section being spaced from the first section and the second section.

20. The CMOS IC of claim 19, wherein the polycrystalline silicon floating gate further comprises a fourth portion connected between the elongated first portion and the elongated third portion and a fifth portion connected between the elongated second portion and the elongated third portion such that the first, second, third, fourth and fifth portions comprise one of a substantially T-shaped polysilicon structure.

21. The CMOS IC of claim 19, wherein the polycrystalline silicon floating gate further comprises a sixth portion connected between the elongated first portion and the elongated second portion, and at least one elongated third portion extends from at least one of said first and second portions such that the first, second, third, and sixth portions comprise one of a substantially C-shaped polysilicon structure, a substantially O-shaped polysilicon structure and a substantially U-shaped polysilicon structure.

22. The CMOS IC of claim 19, further comprising:

a low voltage (LV) MOSFET including a first polysilicon gate having predefined first width that is formed on a first gate oxide having a first oxide thickness, and first lightly doped drain (LDD) regions having a first doping concentration; and a high voltage (HV) MOSFET including a second polysilicon gate having predefined second width that is formed on a second gate oxide, the second gate oxide having a second oxide thickness that is greater than the first oxide thickness, the HV MOSFET also including second LDD regions having a second doping concentration, wherein said polycrystalline silicon floating gate of said multi-terminal NVM cell is formed on a third gate oxide that has the second oxide thickness, and wherein said multi-terminal NVM cell further comprises an implanted region disposed below the third section of the polycrystalline silicon floating gate, said implanted region having a third doping concentration including a sum of said first doping concentration and said second doping concentration.

23. The CMOS IC of claim 22, wherein said implanted region extends entirely under said third section of said polycrystalline silicon floating gate such that said implanted region extends between opposing edges of said drain region located below opposing side edges of said third portion.

24. The CMOS IC of claim 22, further comprising means for generating channel hot electrons (CHE) in the drain region, and means for generating band-to-band tunneling (BBT) holes in the second source region.

\* \* \* \* \*